United States Patent
Kato

(10) Patent No.: US 7,982,790 B2
(45) Date of Patent: Jul. 19, 2011

(54) SOLID-STATE IMAGING APPARATUS AND METHOD FOR DRIVING THE SAME

(75) Inventor: Yoshiaki Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 797 days.

(21) Appl. No.: 11/621,276

(22) Filed: Jan. 9, 2007

(65) Prior Publication Data

US 2007/0165128 A1    Jul. 19, 2007

(30) Foreign Application Priority Data

Jan. 16, 2006    (JP) ................. 2006-007999

(51) Int. Cl.
*H04N 3/14*    (2006.01)
*H04N 5/335*    (2006.01)
(52) U.S. Cl. ...................... 348/312; 348/297
(58) Field of Classification Search .............. 348/294, 348/299, 302, 303, 305, 308, 312, 306, 311, 348/298, 297, 314, 241, 331
See application file for complete search history.

(56) References Cited

U.S. PATENT DOCUMENTS

| | | | | |
|---|---|---|---|---|
| 6,476,941 B1 * | 11/2002 | Kondo et al. | ................. | 358/513 |
| 7,034,876 B2 * | 4/2006 | Harada | ................. | 348/319 |
| 7,050,100 B2 * | 5/2006 | Sakurai et al. | ................. | 348/312 |
| 7,688,371 B2 * | 3/2010 | Koizumi et al. | ................. | 348/308 |
| 2002/0154236 A1 * | 10/2002 | Sakurai et al. | ................. | 348/312 |
| 2006/0102827 A1 | 5/2006 | Kasuga et al. | | |
| 2006/0278948 A1 | 12/2006 | Yamaguchi et al. | | |
| 2006/0284052 A1 | 12/2006 | Toshikiyo et al. | | |
| 2007/0035721 A1 | 2/2007 | Toshikiyo et al. | | |

FOREIGN PATENT DOCUMENTS

JP    2851631    11/1998

OTHER PUBLICATIONS

English Language Abstract of JP 2-161880.

* cited by examiner

*Primary Examiner* — David L Ometz
*Assistant Examiner* — Ahmed Berhan
(74) *Attorney, Agent, or Firm* — Greenblum & Bernstein, P.L.C.

(57) ABSTRACT

To provide a solid-state imaging apparatus which is capable of preventing electric charge from being injected from a semiconductor substrate while electric charge is being accumulated into photodiodes. The solid-state imaging apparatus includes a solid-state imaging device and a driving pulse control unit. The solid-state imaging device includes: a semiconductor substrate, photodiodes which are two-dimensionally formed on the semiconductor substrate, and vertical Charge-coupled devices (CCDs) having at least one arranged read-out gate and non-read-out gate for each of the photodiodes, the read-out gate being for reading out accumulated electric charge from the associated photodiode, and the non-read-out gate being not for reading out accumulated electric charge from the associated photodiode. The driving pulse control unit applies driving pulses sequentially to the respective read-out gates in order to change the read-out gates from stand-by LOW-voltage states to MIDDLE-voltage states, and apply a driving pulse for maintaining a LOW-voltage state of at least one of non-read-out gates adjacent to a last read-out gate in the order of the change among the non-read-out gates, during the change starting with a first read-out gate and ending with the last read-out gate.

18 Claims, 17 Drawing Sheets

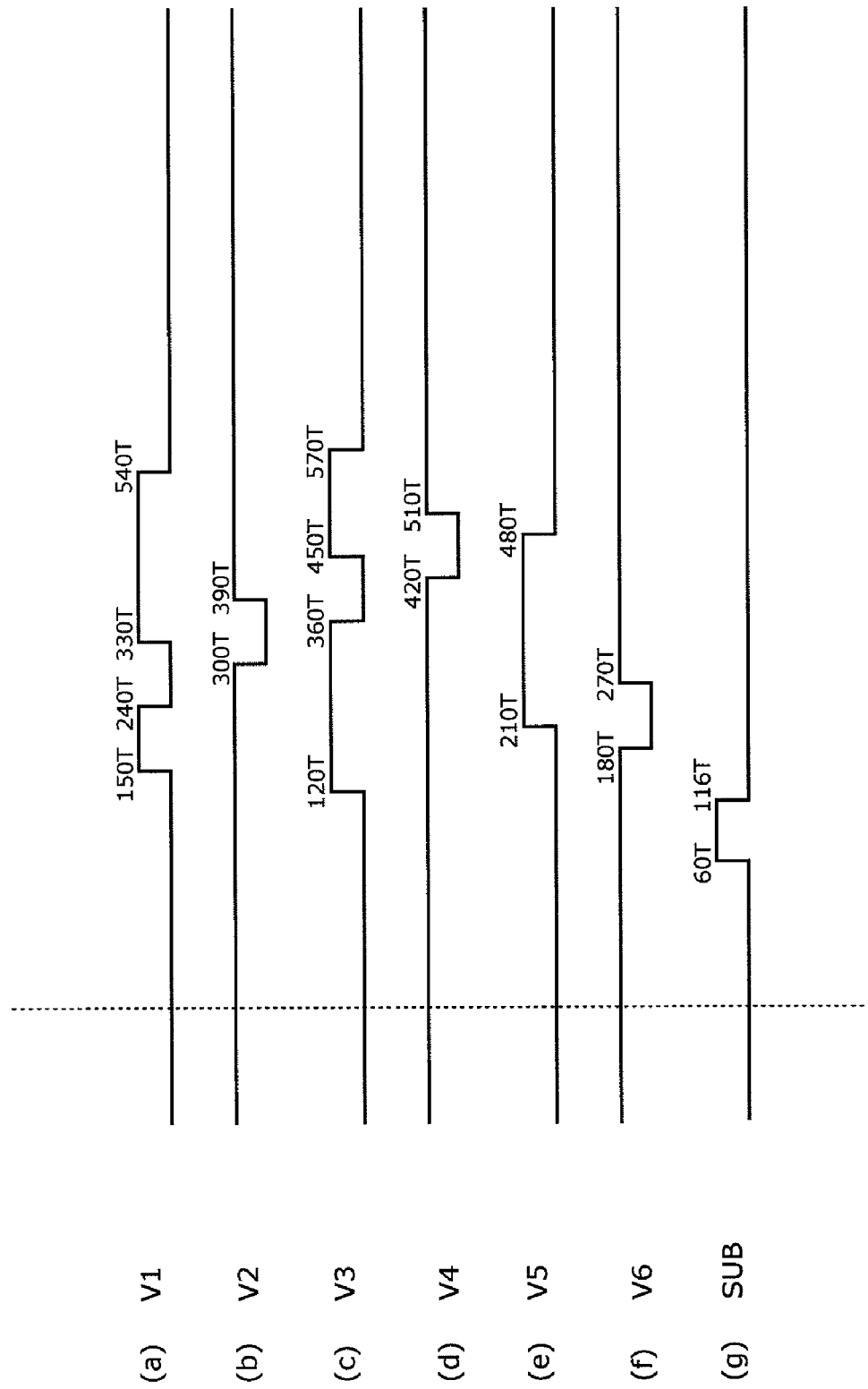

# SOLID-STATE IMAGING APPARATUS AND METHOD FOR DRIVING THE SAME

BACKGROUND OF THE INVENTION (1) Field of the Invention

The present invention relates to a solid-state imaging apparatus such as a CCD image sensor or the like and a method of driving the same, and in particular to a technique preventing white spots at the time of long-time accumulation.

(2) Description of the Related Art

Recently, the definition of a solid-state imaging apparatus has been increased up to 8 mega pixels or the like. This makes it possible to capture a still image as if it is taken by a silver halide camera, and take a video. A frame interline transfer solid-state imaging apparatus (hereinafter referred to as FITCCD) has been developed as a solid-state imaging apparatus in which so-called smear phenomenon rarely occurs.

A description is given below of the structure of a conventional FITCCD and a method of driving the FITCCD with reference to the drawings.

FIG. 1 is a diagram showing an enlarged view of an area of a FITCCD.

First, the structure of the FITCCD is described.

In FIG. 1, a solid-state imaging apparatus 100 includes: photodiodes 101 which are two-dimensionally arranged on a not-shown semiconductor substrate; a vertical CCD 102 for transferring signal electric charge accumulated in the photodiodes 101 in the vertical direction; an accumulation area (not shown) for accumulating the signal electric charge transferred by the vertical CCD 102; a horizontal CCD (not shown) for transferring the electric charge accumulated in the accumulation area in the horizontal direction; an output unit (not shown) for detecting the signal electric charge transferred by the horizontal CCD and outputting the signal electric charge; and a drain unit (not shown) for draining excess electric charge.

The vertical CCD 102 is composed of: a channel area; transfer electrodes (hereinafter referred to as also "read-out gates") 105a, 105b, 105c and 105d each of which has a function as a read-out electrode for reading signal electric charge from the associated photodiode 101; and transfer electrodes (hereinafter referred to as also "non-read-out gates") 104a, 104b, 104c and 104d each of which does not have a function as a read-out electrode for reading out signal electric charge from the associated photodiode 101.

Next, the conventional driving method is described with reference to the diagram of voltage waveforms shown as FIG. 2.

In FIG. 2, $\phi 1$ is a voltage pulse applied to each of the read-out gates 105a and 105c, $\phi 2$ is a voltage pulse applied to each of the non-read-out gates 104b and 104d, $\phi 3$ is a voltage pulse applied to each of the read-out gates 105b and 105d, and $\phi 4$ is a voltage pulse applied to each of the non-read-out gates 104a and 104c.

In the conventional driving method, the voltage pulses $\phi 1$ and $\phi 3$ are at a Low (L) level and the voltage pulses $\phi 2$ and $\phi 4$ are at a High (H) level, for example, in the time period t4 during which electric charge is accumulated in the photodiodes 101. The time period t4 corresponds to a vertical time period and is the time during which electric charge is not read out. In other words, in the conventional driving method, the voltage pulses $\phi 1$ and $\phi 3$ are at the Low (L) level which is opposite in polarity to the High (H) level in the electric charge reading-out time period t2, for example, during the time period t4 in which electric charge is being accumulated in the photodiodes 101. The time period t4 corresponds to a vertical time period and is the time during which electric charge is not read out.

In this way, the potentials of the overlapped parts of the read-out gates 105a, 105b, 105c, and 105d come to undepleted states, and holes are accumulated immediately below the overlapped parts of the read-out gates 105a, 105b, 105c, and 105d. Accordingly, at the photodiode 101 and the overlapped parts of the read-out gates 105a, 105b, 105c, and 105d, dark currents are drastically reduced. Therefore, the quality of a reproduced image is improved.

Patent Reference Japanese Patent Publication No. 2851631

However, in the conventional driving method, when an increase in dark currents is prevented by accumulating holes immediately below read-out gates, over-accumulated holes unstabilize the potential of a semiconductor substrate, and excess electric charge is likely to inversely injected from the semiconductor substrate to photodiodes.

In other words, in a long-time accumulation mode (hereinafter referred to also as long-time accumulation mode) in which electric charge is accumulated in photodiodes during two or more vertical time periods, the potential of the semiconductor substrate is shifted due to the accumulated holes. Hence, white spots to be obstacles occur when reading out electric charge accumulated in the photodiodes. Excess electric charge to be obstacles when transferring the read-out electric charge is injected also to the channels of the vertical CCD.

The problem is noticeable particularly in the case of a refined CCD which is likely to induce an electric field concentration.

SUMMARY OF THE INVENTION

To solve the problem, the present invention aims at providing a solid-state imaging apparatus which is capable of preventing electric charge from being injected from the semiconductor substrate when the potential of the semiconductor substrate becomes unstable while electric charge is being accumulated into photodiodes and a method of driving the solid-state imaging apparatus.

In order to achieve the above-described object, the solid-state imaging apparatus according to the present invention includes: a solid-state imaging device including a semiconductor substrate, photodiodes which are two-dimensionally formed on the semiconductor substrate, and vertical charge-coupled devices (CCDs) having at least one arranged read-out gate and non-read-out gate for each of the photodiodes. The read-out gate is for reading out accumulated electric charge from the associated photodiode, and the non-read-out gate is not for reading out accumulated electric charge from the associated photodiode. The solid-state imaging apparatus includes: a driving pulse control unit which controls the solid-state imaging device by applying driving pulses to the respective read-out gates and non-read-out gates at predetermined timings. The driving pulse control unit in the apparatus applies driving pulses sequentially to the respective read-out gates in order to change the read-out gates from stand-by LOW-voltage states to MIDDLE-voltage states; and applies a driving pulse for maintaining a LOW-voltage state of at least one of non-read-out gates adjacent to a last read-out gate in the order of the change among the non-read-out gates, during the change starting with a first read-out gate and ending with the last read-out gate.

In this way, the holes accumulated while the read-out gates are at LOW-voltage states are released, and the released holes are dispersed sequentially and smoothly in the direction of the non-read-out gates. Accordingly, it is possible to prevent electric charge from being injected from the semiconductor substrate because the stability of the potential of the semiconductor substrate is maintained even while the holes are being released. In addition, it is possible to prevent white spots from occurring due to electric charge generated when the holes move. In particular, such injection problem does not occur even when Vsub of the semiconductor substrate is lowered because the semiconductor substrate is stabilized even in the case of driving to lower Vsub while electric charge is being accumulated into photodiodes.

In addition, the solid-state imaging apparatus according to the present invention may include: a solid-state imaging device including a semiconductor substrate, photodiodes which are two-dimensionally formed on the semiconductor substrate, and vertical CCDs having at least one arranged read-out gate and non-read-out gate for each of the photodiodes. The read-out gate is for reading out accumulated electric charge from the associated photodiode, and the non-read-out gate is not for reading out accumulated electric charge from the associated photodiode. The solid-state imaging apparatus may include a driving pulse control unit which controls the solid-state imaging device by applying driving pulses to the respective read-out gates and non-read-out gates at predetermined timings. The solid-state imaging device in the apparatus may read out electric charge accumulated in all of the photodiodes to the vertical CCDs by executing N-times of read-out operations. The driving pulse control unit may apply driving pulses sequentially for changing N-numbers of read-out gates from stand-by LOW-voltage states to MIDDLE-voltage states, and apply a driving pulse for maintaining a LOW-voltage state of at least one of non-read-out gates adjacent to N−1th read-out gate and Nth read-out gate in an order of the change among the non-read-out gates, during the change starting with the N−1th read-out gate and ending with the Nth read-out gate.

In this way, the holes accumulated while the read-out gates are at LOW-voltage states are released, and the released holes are dispersed sequentially and smoothly in the direction of the non-read-out gates. Accordingly, it is possible to prevent electric charge from being injected from the semiconductor substrate because the stability of the potential of the semiconductor substrate is maintained even while the holes are being released. In addition, it is possible to prevent white spots from occurring due to electric charge generated when the holes move. In particular, such injection problem does not occur even when Vsub of the semiconductor substrate is lowered because the semiconductor substrate is stabilized even in the case of driving to lower Vsub while electric charge is being accumulated into photodiodes.

In addition, the solid-state imaging apparatus according to the present invention may include: a solid-state imaging device including a semiconductor substrate, photodiodes which are two-dimensionally formed on the semiconductor substrate, and vertical CCDs having at least one arranged read-out gate and non-read-out gate for each of the photodiodes. The read-out gate is for reading out accumulated electric charge from the associated photodiode, and the non-read-out gate is not for reading out accumulated electric charge from the associated photodiode. The solid-state imaging apparatus may include a driving pulse control unit which controls the solid-state imaging device by applying driving pulses to the respective read-out gates and non-read-out gates at predetermined timings. The driving pulse control unit in the apparatus may apply driving pulses sequentially to the respective read-out gates in order to change the read-out gates from stand-by LOW-voltage states to MIDDLE-voltage states simultaneously.

In this way, the holes are released before a read-out gate is filled with accumulated holes, and therefore, the released holes are dispersed sequentially and smoothly in the direction of the non-read-out gates. Accordingly, it is possible to prevent electric charge from being injected from the semiconductor substrate because the stability of the potential of the semiconductor substrate is maintained even while the holes are being released. In addition, it is possible to prevent white spots from occurring due to electric charge generated when the holes move.

In addition, in the solid-state imaging apparatus according to the present invention, the driving pulse control unit may further apply driving pulses for changing the non-read-out gates from MIDDLE-voltage states to LOW-voltage states in parallel with applying driving pulses for changing the read-out gates from stand-by LOW-voltage states to MIDDLE-voltage states.

In this way, the released holes are dispersed sequentially and further smoothly in the direction of the non-read-out gates. Accordingly, it is possible to prevent electric charge from being injected from the semiconductor substrate because the stability of the potential of the semiconductor substrate is maintained even while the holes are being released. In addition, it is possible to prevent white spots from occurring due to electric charge generated when the holes move.

In addition, in the solid-state imaging apparatus according to the present invention, the solid-state imaging device may read out electric charge accumulated in all of the photodiodes to the vertical CCDs by executing N-times of read-out operations. The driving pulse control unit may further apply driving pulses for changing all of gates from LOW-voltage states to MIDDLE-voltage states at the starting time of transfer operation of a field or a frame. The gates are composed of N-numbers of read-out gates and at least N-numbers of non-read-out gates, and the application is executed as a transition operation preparatory to the transfer operation.

In this way, pulses for changing the voltage states of the respective gates are applied to the gates at different timings, unnecessary electric charge is dispersed, and thus charge infusion from the semiconductor substrate is prevented. Accordingly, it is possible to prevent white spots from occurring due to electric charge generated at the time when holes move.

In addition, in the solid-state imaging apparatus according to the present invention, the driving pulse control unit may execute the transition operation either (a) at the starting time of transferring a first field or (b) at the starting time of transferring the vertical CCDs at high speed.

This suppresses inverse infusion of unnecessary electric charge before vertical transfer is started, which makes it possible to prevent white spots from occurring.

In addition, in the solid-state imaging apparatus according to the present invention, the driving pulse control unit may further execute a first bias modulation and a second bias modulation. The first bias modulation is for accumulating signal electric charge up to the height of each read-out gate by changing the overflow barrier of the read-out gate to a high level before the end of an exposure time period, and the second bias modulation is for changing the height of the overflow barrier to a low level between the end of the exposure time period and the start of sweeping out of electric charge of the vertical CCDs; and execute the transition operation between the end of the exposure time period and the start of the second bias modulation.

This makes it possible to prevent blooming.

In addition, the solid-state imaging apparatus according to the present invention may include a solid-state imaging device including a semiconductor substrate, photodiodes which are two-dimensionally formed on the semiconductor substrate, and vertical CCDs having at least one arranged read-out gate and non-read-out gate for each of the photodiodes. The read-out gate is for reading out accumulated electric charge from the associated photodiode, and the non-read-out gate is not for reading out accumulated electric charge from the associated photodiode. The solid-state imaging apparatus includes a driving pulse control unit which controls the solid-state imaging device by applying driving pulses to the respective read-out gates and non-read-out gates at predetermined timings. In the apparatus, the driving pulse control unit may further apply driving pulses for changing all of gates from LOW-voltage states to MIDDLE-voltage states at the starting time of transfer operation of a field or a frame. The gates are composed of N-numbers of read-out gates and at least N-numbers of non-read-out gates, and the application is executed as a transition operation preparatory to the transfer operation.

Also in this way, pulses for changing the voltage states of the respective gates are applied to the gates at different timings, unnecessary electric charge is dispersed, and thus charge infusion from the semiconductor substrate is prevented. Accordingly, it is possible to prevent white spots from occurring due to electric charge generated at the time when holes move.

Note that the present invention can be realized not only as a solid-state imaging apparatus like this, but also as a driving method having the steps corresponding to the unique units that the solid-state imaging apparatus has and as a program causing a computer to execute these steps. In addition, the program can be distributed via a recording medium such as a CD-ROM and a communication medium such as the Internet. Furthermore, the present invention can be structured as a camera having the solid-state imaging apparatus.

As clear from the above descriptions, with the solid-state imaging apparatus according to the present invention, holes accumulated when the read-out gates are in LOW-voltage states are released, and the released holes are dispersed sequentially and smoothly in the direction of non-read-out gates. Accordingly, it is possible to prevent the potential of the semiconductor substrate from becoming unstable when the holes are accumulated and prevent electric charge from being injected from the semiconductor substrate. In particular, the semiconductor substrate becomes stable even in the case of lowering Vsub of the semiconductor substrate when electric charge is accumulated into photodiodes, and thus no injection problem occurs even in the case of lowering Vsub.

Accordingly, the present invention makes it possible to prevent white spots from occurring, and thus the present invention is highly applicable today when digital cameras become increasingly popular.

FURTHER INFORMATION ABOUT TECHNICAL BACKGROUND TO THIS APPLICATION

The disclosure of Japanese Patent Application No. 2006-007999 filed on Jan. 16, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 7 is a diagram showing normal timings in a long-time accumulation mode;

DESCRIPTION OF THE PREFERRED EMBODIMENT(S)

Embodiments of the present invention will be described below in detail with reference to the drawings.

First Embodiment

Figure 3:
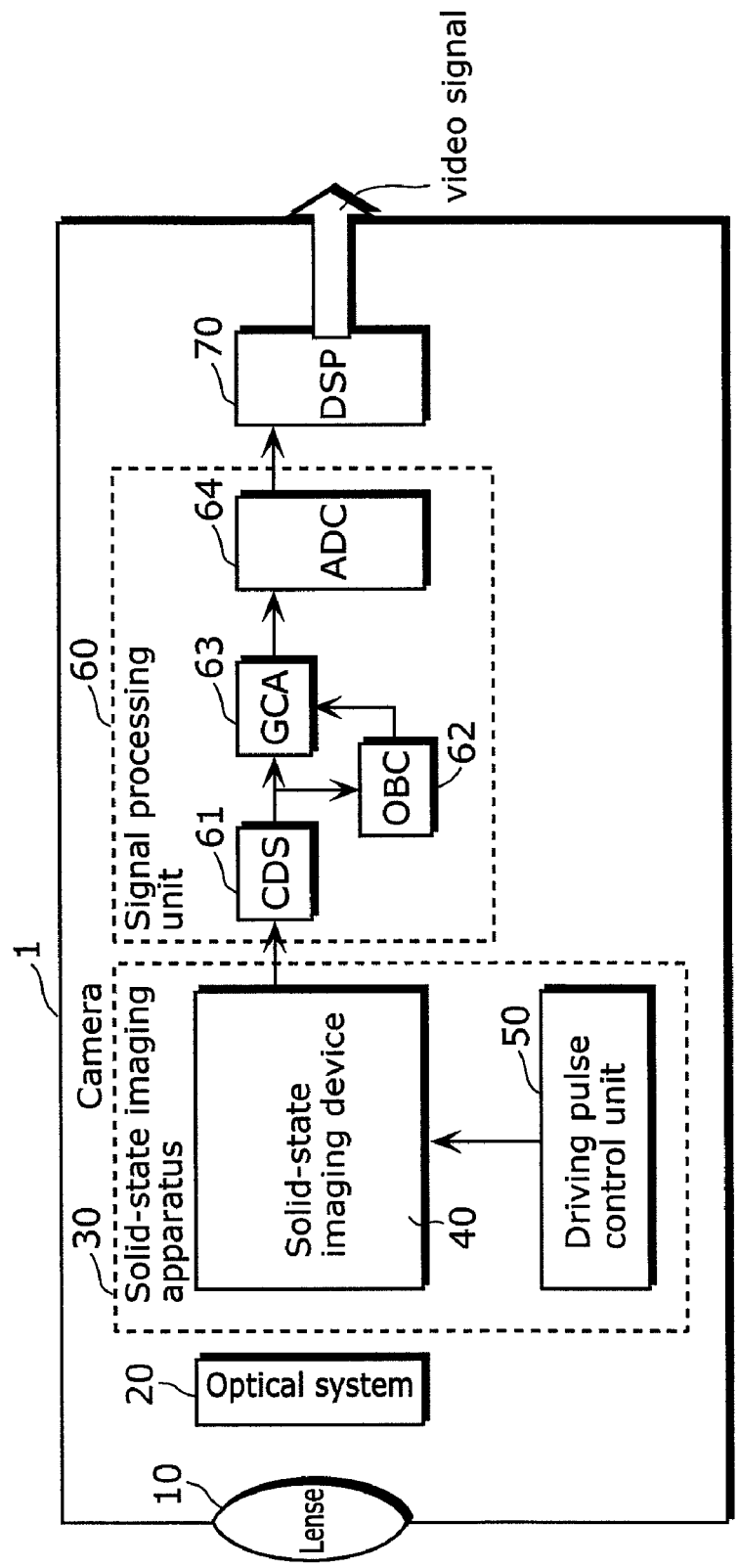
FIG. 3 is a diagram showing the structure of a camera using a solid-state imaging apparatus according to a first embodiment.

FIG. 3 is a diagram showing the structure of a camera using a solid-state imaging apparatus according to this embodiment.

As shown in FIG. 3, the camera 1 includes: a lense 10 with which an optical image of an subject is formed on an imaging device; a mirror with which the optical image that passed through the lense 10 is subjected to optical processing; an optical system 20 such as a mechanical shutter; a solid-state imaging apparatus 30 according to the present invention; a signal processing unit 60; a digital signal processor (hereinafter referred to as also "DSP") 70 and the like.

The solid-state imaging apparatus 30 includes a solid-state imaging device 40 and a driving pulse control unit 50.

The solid-state imaging device 40 is realized as a CCD image sensor or the like, and outputs a pixel signal in accordance with the amount of received light.

The driving pulse control unit 50 drives the solid-state imaging device 40 by generating various kinds of driving pulses onto the solid-state imaging device 40 at various timings according to the DSP 70.

The signal processing unit 60 includes: a Correlated Double Sampling (CDS) circuit 61 which takes a difference between a field-through signal outputted from the solid-state imaging device 40 and an output signal; an OB clamping circuit 62 which detects an Optical Black (OB)-level signal outputted from the CDS circuit 61; a Gain Control Amplifier (GCA) 63 which takes a difference between the OB level and the signal level of effective pixels and adjusts the gain of the difference; and an Analog-to-Digital Converter (ADC) 64 which converts an analog signal outputted from the GCA 63 to a digital signal.

The DSP 70 executes signal processing on a digital signal outputted from the ADC 64, and executes control of the driving pulse control unit 50.

Figure 4:
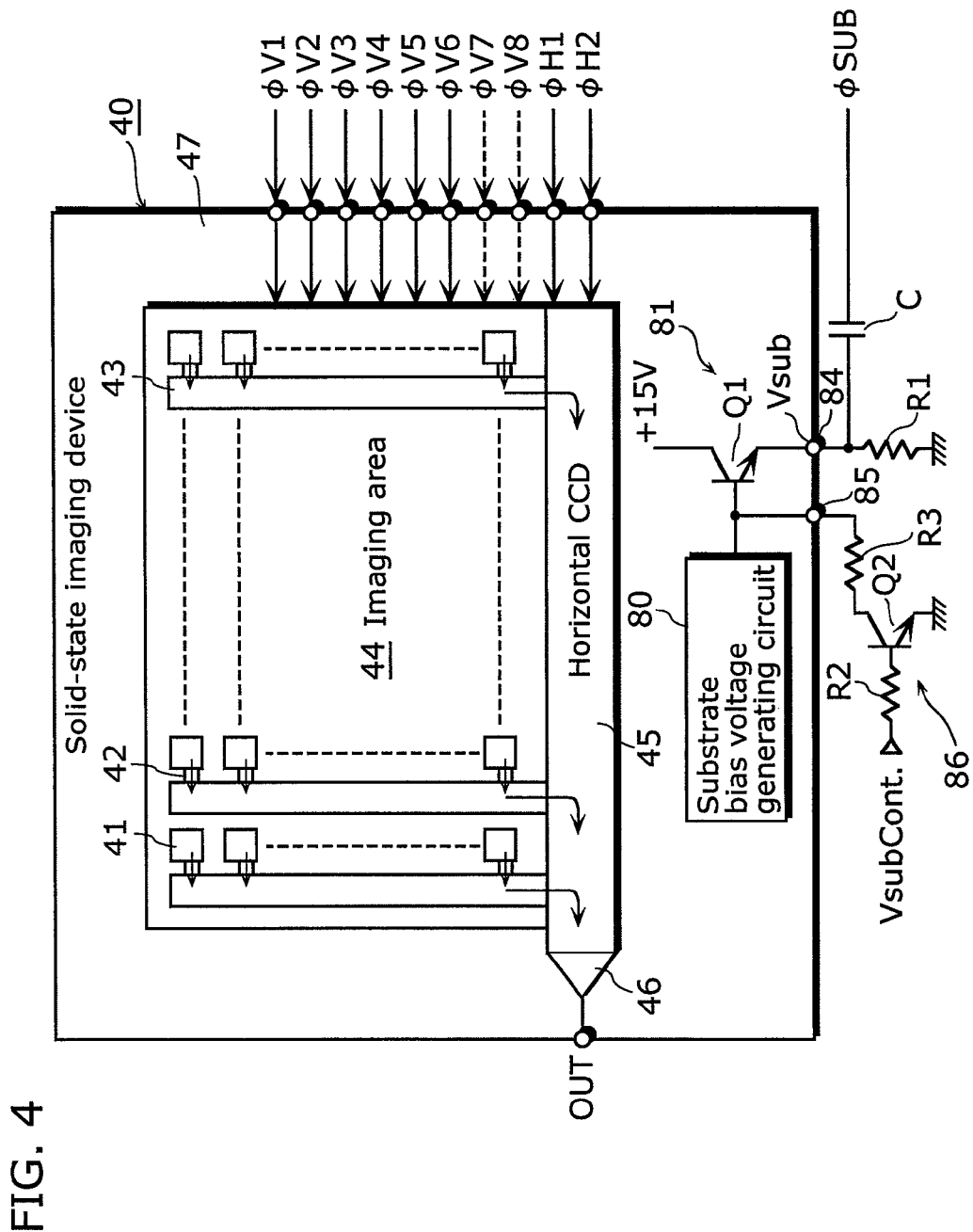
FIG. 4 is a block diagram showing the structure of a solid-state imaging device 40 shown in FIG. 3.

FIG. 4 is a block diagram showing the structure of the solid-state imaging device 40 shown in FIG. 3.

As shown in FIG. 4, the solid-state imaging device 40 is an interline transfer (IT) type CCD image sensor, and includes: a semiconductor substrate 47; photodiodes 41 which are two-dimensionally arranged on the semiconductor substrate 47; a horizontal CCD 45; read-out gate units 42; a vertical CCD 43; a horizontal CCD 45; an output amplifier 46; a substrate bias voltage generating circuit 80; and a transistor Q1. In addition, the figure also shows a transistor Q2, resistors R1 to R3, and a capacitor C as a circuit which modulates bias voltage (hereinafter referred to as also substrate bias) Vsub of the semiconductor substrate 47 of the solid-state imaging device.

The solid-state imaging device 40 is structured to execute control of this substrate bias Vsub so as to estimate a decrease in the amount of saturation signal electric charge Qs at the time of reading out frames and increase the amount of saturation signal electric charge Qs by the estimated decrease in advance. The frame read-out method used here is the method of reading out the signal electric charge of odd lines and the signal electric charge of even lines on a per field basis in a state where the mechanical shutter (not shown) of the optical system 20 is closed after an exposure time elapsed. This method is often used in the case of obtaining a still picture.

In FIG. 4, the plural photodiodes 41 are two-dimensionally arranged so as to form an imaging area 44. Each of the photodiodes 41 converts incident light into a signal electric charge in accordance with the amount of light and accumulates the signal electric charge. Each of the photodiodes 41 is, for example, a PN-conjunction photodiode. The signal electric charge accumulated in the photodiodes 41 which constitute a vertical row are read out to vertical CCDs 43 when a read-out pulse XSG is applied to the read-out gate units 42. The non-read-out gates have been intentionally omitted from FIG. 4 to facilitate clarity of the illustrated solid-state imaging device. However, the non-read-out gates are arranged in a manner similar to that illustrated in FIG. 1.

A vertical CCD 43 is placed at each vertical row of photodiodes 41, and vertically transfers the signal electric charge read out from each of the photodiodes 41 via the read-out gate units 42 to the horizontal CCD 45. In the case of an IT-type solid-state imaging device, on each vertical CCD 43, vertical transfer gate electrodes for transfer driving are repeatedly arranged similarly to the case of FIG. 1, for example, by six-phase vertical transfer clocks $\phi V1$ to $\phi V6$, and the signal electric charge read out from the photodiodes 41 are transferred sequentially in the vertical direction. In this way, signal electric charge corresponding to a scanning line (one line) is outputted from the plural vertical CCDs 43 to the horizontal CCD 45 in a horizontal blanking time period. The second phase $\phi V2$, the fourth phase $\phi V4$, and the sixth phase $\phi V6$ among the six-phase vertical transfer clocks $\phi V1$ to $\phi V6$ may take two values of a low level and a middle level for vertical transfer. In contrast, the vertical transfer gate electrodes corresponding to the first phase, the third phase, and the fifth phase function also as the read-out gate electrodes of the read-out gate units 42. Thus, the vertical transfer clocks $\phi V1$, $\phi V3$, and $\phi V5$ may take three values of a low level, a middle level and a high level. This third value of a high-level pulse becomes a read-out pulse XSG to be provided to the read-out gate units 42.

In the case where the vertical CCD 43 is structured to drive to transfer by the vertical transfer clocks $\phi V1$ to $\phi V8$, the second phase $\phi V2$, the fourth phase $\phi V4$, the sixth phase $\phi V6$, and the eighth phase $\phi V8$ among the eight-phase vertical transfer clocks $\phi V1$ to $\phi V8$ are applied to non-read-out gates, and the vertical transfer clocks $\phi V1$, $\phi V3$, $\phi V5$ and $\phi V7$ are applied to the read-out gates. Here, six-phase driving is mainly described.

The horizontal CCD 45 horizontally transfers the electric charge sequentially within a horizontal scanning time period. The electric charge is in a line and is transferred from vertical CCDs 43 in a horizontal blanking time period. The horizontal CCD 45 outputs the electric charge via the output amplifier 46. This horizontal CCD 45 is driven to transfer by, for example, two-phase horizontal transfer clocks $\phi H1$ and $\phi H2$, and sequentially transfers the signal electric charge in a line and transferred from the plural lines of vertical CCDs 43 in the horizontal direction in the horizontal scanning time period which is subsequent to the horizontal blanking time period.

The output amplifier 46 converts the signal electric charge horizontally transferred by the horizontal CCD 45 into voltage signals sequentially and outputs the voltage signals.

The substrate bias voltage generating circuit 80 generates substrate bias voltage Vsub, and applies the substrate bias voltage Vsub to the semiconductor substrate 47 via the transistor Q1. This substrate bias Vsub is set at a first bias voltage when the transistor Q2 is OFF under control of a VsubCont signal, and is set at a second bias voltage which is lower than the first voltage when the transistor Q2 is ON.

The solid state imaging device 40 is formed on the semiconductor substrate (hereinafter simply referred to as substrate) 47. To the semiconductor substrate 47, various kinds of timing signals are applied. Such signals include a substrate shutter pulse $\phi SUB$ for sweeping out the signal electric charge accumulated in the photodiodes 41 to the semiconductor substrate 47. Note that the substrate shutter function by the substrate shutter pulse $\phi SUB$ is also called as an electronic shutter.

Figure 5:
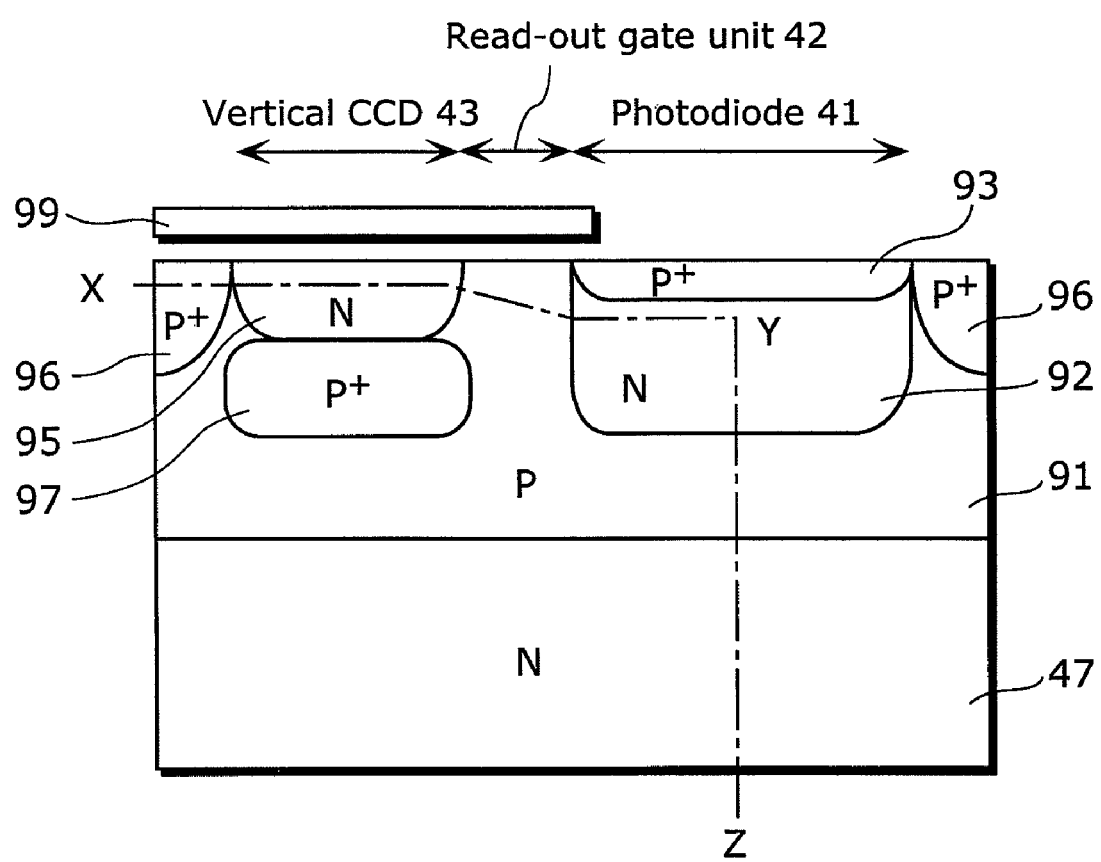
FIG. 5 is a sectional view showing the structure of a part including a photodiode 41 and a vertical CCD 43 in the depth direction of a substrate.

FIG. 5 is a sectional view showing the structure of a part including a photodiode 41 and a vertical CCD 43 in the depth direction of the substrate.

In the figure, a P-type well area 91 is formed on the surface of, for example, an N-type semiconductor substrate 47. On the surface of the P-type well area 91, an N-type signal electric charge accumulation area 92 is formed, and on the N-type signal electric charge accumulation area 92 a $P^+$-type hole accumulation area 93 is further formed so as to structure a photodiode 41.

The amount of signal electric charge e accumulated in this photodiodes 41 is determined depending on the height of the potential barrier of the overflow barrier OFB formed in the P-type well area 91. This overflow barrier OFB determines the amount of saturation signal electric charge Qs accumulated in the photodiode 41. In the case where the amount of accumulated electric charge exceeds the amount of saturation signal electric charge Qs, the excessive electric charge is swept out to the side of the semiconductor substrate 47 over the potential barrier.

In this way, a photodiode 41 having a so-called vertical-type overflow drain structure is structured.

In the horizontal direction of the photodiode 41, an N-type signal electric charge transfer area 95 and a $P^+$-type channel stopper area 96 are formed via the part which structures the read-out gate unit 42 of the P-type well area 91. Under the signal electric charge transfer area 95, a $P^+$-type impurity dispersion area 97 for preventing smear components from being mixed is formed, and above the signal electric charge transfer area 95, for example, transfer electrodes 99 made of polycrystalline silicon are further arranged so as to structure a vertical CCD 43. The transfer electrodes 99 have parts which are positioned above the P-type well area 91, and the parts function also as a gate electrode of the read-out gate unit 42.

Onto the semiconductor substrate 47, a substrate bias Vsub is applied. The substrate bias Vsub determines the amount of signal electric charge accumulated in the photodiode 41 (in other words, determines the potential of the overflow barrier OFB).

Figure 6:
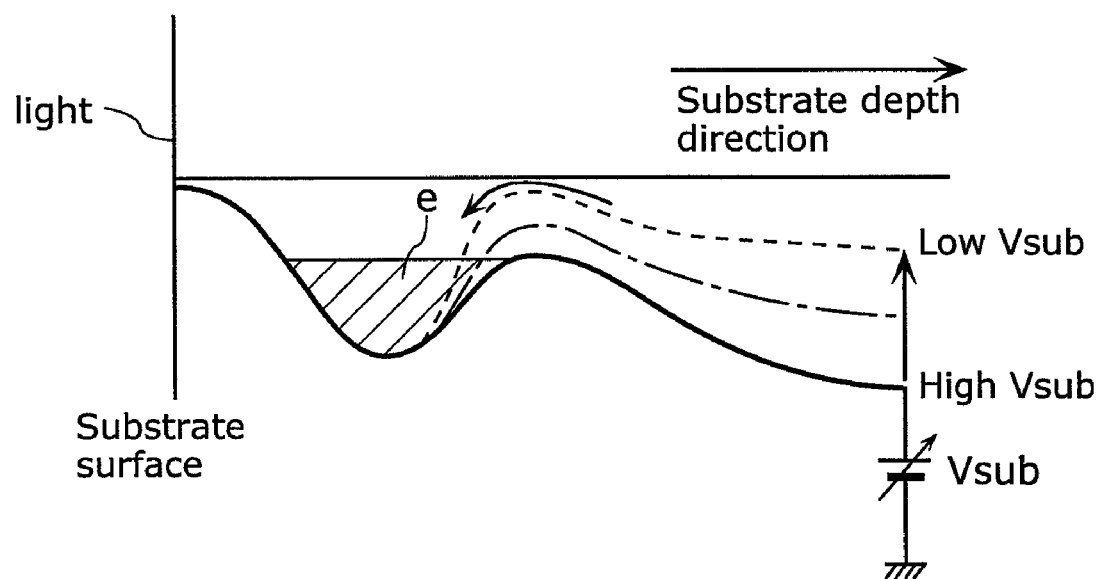
FIG. 6 is a diagram showing a potential distribution in the substrate depth direction of the photodiode 41.

FIG. 6 is a diagram showing the potential distribution of a photodiode 41 in the substrate depth direction.

The amount of the signal electric charge e accumulated in this photodiode 41 is determined depending on the height of the potential barrier of the overflow barrier OFB. In other words, the overflow barrier OFB determines the amount of saturation signal electric charge Qs accumulated in the photodiode 41. In the case where the amount of accumulated electric charge exceeds this amount of saturation signal electric charge Qs, the excessive electric charge is swept out to the side of the semiconductor substrate 47 over the potential barrier. The potential of the overflow barrier OFB in the vertical-type overflow drain structure like this can be controlled by an overflow drain bias, that is, the substrate bias Vsub. In other words, the height of the barrier can be controlled by the substrate bias Vsub.

The driving pulse control unit 50 executes a long-time accumulation mode when there is an instruction from a DSP 70 to accumulate electric charge in photodiodes 41 during the time (for example, 8 seconds) equal to or more than two vertical time periods, and the mechanical shutter of the optical system 20 is opened. Next, when an indicated time elapsed and the mechanical shutter is closed, the driving pulse control unit 50 completes the execution of the long-time accumulation mode, drives to transfer only the vertical CCD 43, and executes the vertical CCD sweep-out mode for sweeping out noises in the channel of the vertical CCD 43. Next, when the execution of the vertical CCD sweep-out mode is completed, the driving pulse control unit 50 causes the vertical CCD 43 to read out electric charge accumulated in all the photodiodes 41. It transfers the read-out electric charge from the vertical CCD 43 to the accumulation unit 49, and further to the horizontal CCD 45, and outputs it via the output amplifier 46.

Next, a description is given of processing preventing white spots in a long-time accumulation mode executed in the driving pulse control unit 50.

Here, a description is given of normal timings in a long-time accumulation mode before describing the processing preventing white spots in a long-time accumulation mode executed in the driving pulse control unit 50 according to the present invention.

FIG. 7 is a diagram showing normal timings in a long-time accumulation mode.

FIGS. 7(a) to 7(f) each shows the above-mentioned six-phase driving pulses φV1 to φV6, and FIG. 7(g) shows the SUB pulse.

In normal timings in this long-time accumulation mode, the driving pulse control unit 50 outputs the SUB pulse during change points 60T to 116T first in a horizontal time period. As to the driving pulse φV1, the driving pulse control unit 50 changes it to a middle level during the change points 150T to 240T and the change points 330T to 540T. As to the driving pulse φV2, the driving pulse control unit 50 changes it to the low level during the change points 300T to 390T. As to the driving pulse φV3, the driving pulse control unit 50 changes it to the middle level during the change points 120T to 360T and the change points 450T to 570T. As to the driving pulse φV4, the driving pulse control unit 50 changes it to the low level during the change points 420T to 510T. As to the driving pulse φV5, the driving pulse control unit 50 changes it to the middle level during the change points 210T to 480T. As to the driving pulse φV6, the driving pulse control unit 50 changes it to the low level during the change points 180T to 270T.

Next, a description is given of comparison between the normal timings like this and the timings in a long-time accumulation mode according to the present invention.

FIG. 8 and FIG. 9 each is a diagram showing difference between fields on the appearance of white spots through comparison between the normal timings and the timings according to the present invention. Here, white spot levels may vary depending on each photodiode to be read out in the respective read-out gates φV1, φV3 and φV5, and such difference is called as difference between fields on the appearance of white spots.

Figure 8A:
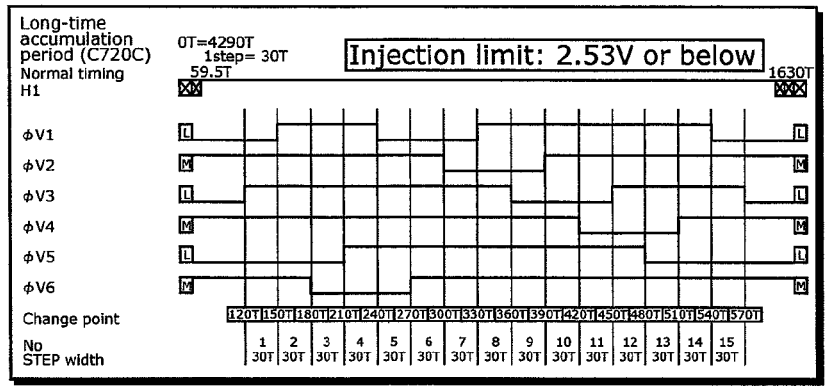
FIGS. 8a-8d are diagrams showing the difference between fields on the appearance of white spots obtained by comparing the normal timings with the timings according to the present invention.

FIG. 8(a) is a diagram showing normal timings of the above-mentioned FIG. 7. Note that the injection limit substrate voltage injected from the semiconductor substrate to photodiodes is equal to or less than 2.53V at this time.

As for the driving pulses, φV1, φV3 and φV5 are maintained at the low level, φV2, φV4 and φV6 are maintained at the middle level, and holes are accumulated immediately below the respective read-out gates which are set at the low level.

When the driving pulse φV3 is changed into the middle level in the change point 120T, the holes accumulated immediately below the read-out gate to which this driving pulse φV3 is applied are released and the released holes are dispersed in the direction of the non-read-out gates to which the driving pulses φV2 and φV4 are applied.

Next, when the driving pulse φV1 is changed into the middle level in the change point 150T, the holes accumulated immediately below the read-out gate to which this driving pulse φV1 is applied are released and the released holes are dispersed in the direction of the non-read-out gates to which the driving pulses φV2 and φV6 are applied.

Next, the driving pulse φV6 is changed into the low level in the change point 180T.

Next, when the driving pulse φV5 is changed into the middle level in the change point 210T, the holes accumulated immediately below the read-out gate to which this driving pulse φV5 is applied are released and the released holes try to be dispersed in the direction of the non-read-out gates to which the driving pulses φV4 and φV6 are applied. However, non-read-out gates to which the driving pulse φV4 and φV6 are applied already have dispersed holes, and further, the non-read-out gate to which the driving pulse φV6 is applied still has dispersed holes because only a short time elapsed after it is set at the low level. Accordingly, the holes accumulated immediately below the read-out gate to which the driving pulse φV5 is applied are difficult to be dispersed.

In addition, in the case where holes move drastically triggered by an operation of releasing holes, electrons generated due to an influence such as impact ions are accumulated as noises in photodiodes, resulting in causing a trouble by white spots.

Figure 8B:
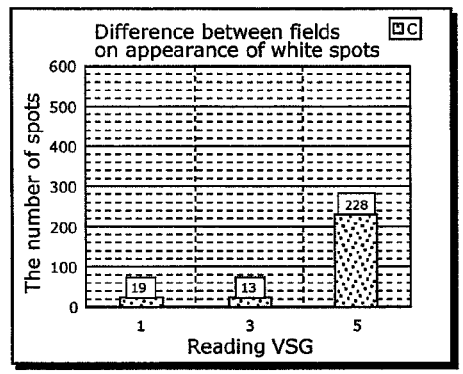

FIG. 8(b) is a diagram showing the relationship between these normal timings and the number of white spots. As shown in the figure, the number of whit spots increases drastically at the time when the driving pulse φV5 is changed into the middle level.

Figure 8C:
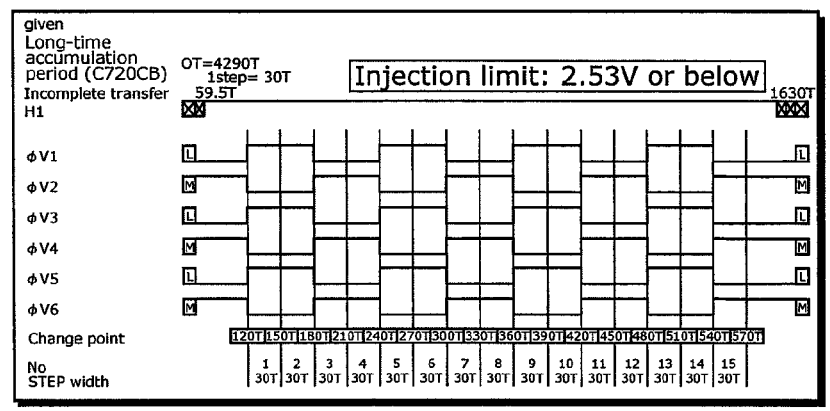

In contrast, FIG. 8(c) is a diagram showing the first timing in a long-time accumulation mode according to the present invention. Note that the injection limit substrate voltage injected from the semiconductor substrate to the photodiodes is equal to or less than 2.53V at this time, which shows that the potential of the semiconductor substrate is stable equally to that in the conventional art.

In other words, as shown in FIG. 8(c), the driving pulse control unit 50 simultaneously changes the driving pulses φV1, φV3 and φV5 into the middle level during the change points from 120T to 180T, 240T to 300T, 360T to 420T, and 480T to 540T. In contrast to the driving pulses φV1, φV3 and φV5, the driving pulse control unit 50 simultaneously changes the driving pulses φV2, φV4 and φV6 into the low level during the change points from 120T to 180T, 240T to 300T, 360T to 420T, and 480T to 540T. Hereinafter, simultaneous driving like this is denoted also as "pumping drive".

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

With a pumping drive by the driving pulses φV1, φV3 and φV5 like this, the holes are released before a read-out gate is filled with accumulated holes, and therefore, the released holes are dispersed sequentially and smoothly in the direction of the non-read-out gates. Accordingly, it is possible to prevent electric charge from being injected from the semiconductor substrate because the stability of the potential of the semiconductor substrate is maintained even while the holes are being released. In addition, it is possible to prevent white spots from occurring due to electric charge generated when the holes move.

With the pumping drive by the driving pulses φV2, φV4 and φV6 like this, released holes are sequentially dispersed further smoothly in the non-read-out gates. Accordingly, it is possible to maintain the stability of the potential of the semiconductor substrate even when holes are released and prevent electric charge from being injected from the semiconductor substrate. In addition, it is also possible to prevent white spots caused by electric charge generated when the holes move.

Figure 8D:
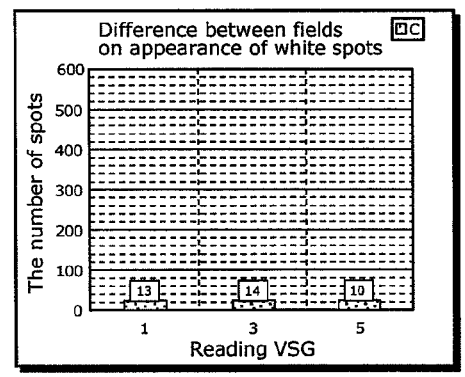

FIG. 8(d) is a diagram showing the relationship between the timings of this pumping drive and the number of white spots. As shown in the figure, the number of white spots decreases drastically at the time when the driving pulses φV1, φV3 and φV5 are changed into the middle level.

Figure 9A:
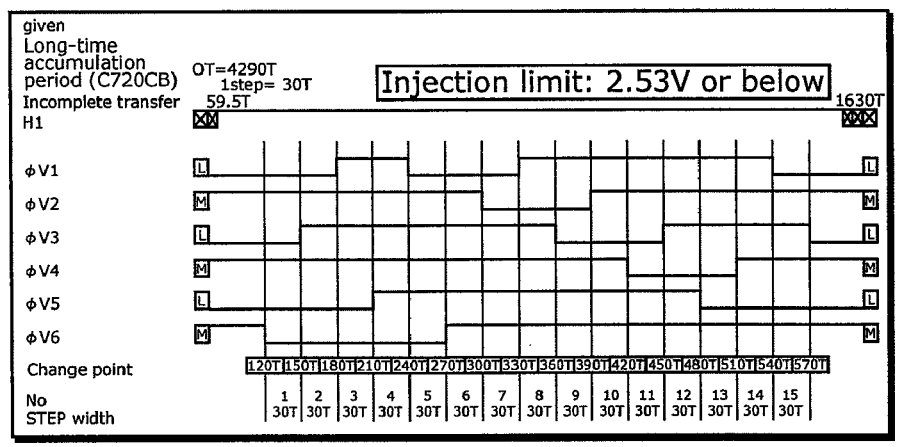
FIGS. 9a and 9b are diagrams showing the difference between fields on the appearance of white spots obtained by comparing the normal timings with the timings according to the present invention.

In contrast, FIG. 9(a) is a diagram showing the second timing in a long-time accumulation mode according to the present invention. Note that the injection limit substrate voltage injected from the semiconductor substrate to the photodiodes is equal to or less than 2.53V at this time, which shows that the potential of the semiconductor substrate is stable equally to that in the conventional art.

FIG. 9(a) shows the following. As to the driving pulse φV6, the driving pulse control unit 50 changes it to the low level during the change points 120T to 270T. As to the driving pulse φV1, the driving pulse control unit 50 changes it to the middle level during the change points 180T to 240T and the change points 330T to 540T. As to the driving pulse φV2, the driving pulse control unit 50 changes it to the low level during the change points 300T to 390T. As to the driving pulse φV3, the driving pulse control unit 50 changes it to the middle level during the change points 150T to 360T and the change points 450T to 510T. As to the driving pulse φV4, the driving pulse control unit 50 changes it to the low level during the change points 420T to 510T. As to the driving pulse φV5, the driving pulse control unit 50 changes it to the middle level during the change points 210T to 480T.

In other words, the point of changing the driving pulse φV6 to the low level and then sequentially changing the driving pulses φV3, φV1, and φV5 to the middle level is greatly different from the general driving method shown in FIG. 8(a).

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

With the driving like this, the holes accumulated immediately below the non-read-out gate become stable since long time elapsed after the non-read-out gate to which the driving pulse φV6 is applied was set at the low level. Since the gate is at the low level, a route through which holes are easy to move is formed. Accordingly, when a middle level voltage is applied to a terminal or line to which the driving pulse φV5 is applied, the holes accumulated immediately below the gate at the low level are easy to move to the adjacent φV6 gate, and thus the holes are very easy to be dispersed.

In this way, the holes accumulated at the time when the read-out gate is in a low voltage state are released, and the released holes are dispersed sequentially and smoothly in the non-read-out gate. Accordingly, it is possible to maintain the stability of the potential of the semiconductor substrate even when holes are released, and to prevent the electric charge from being injected from the semiconductor substrate. In addition, it is possible to prevent white spots caused by the electric charge generated when the holes move. In particular, the semiconductor substrate is stable even in the case of driving to lower Vsub of the semiconductor substrate while electric charge is being accumulated into photodiodes. Therefore, no injection problem occurs even when Vsub is lowered.

Figure 9B:
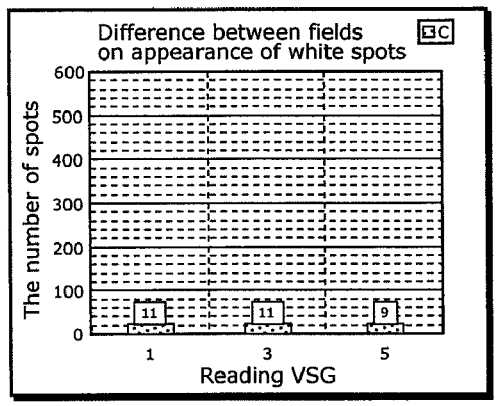

FIG. 9(b) is a diagram showing the relationship between this second driving timing and the number of white spots. As shown in the figure, it is known that the number of white spots decreases drastically at the time when the driving pulses φV1, φV3, and φV5, are changed into the middle level.

Next, drive dependency of difference between fields on the appearance of white spots is analyzed.

FIG. 10 and FIG. 11 each is a diagram showing the relationship between the timings indicating drive dependency of difference between fields on the appearance of white spots and the numbers of white spots.

Figure 10A:
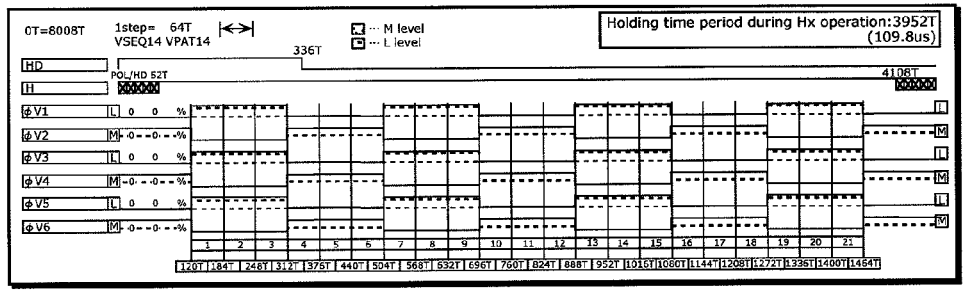
FIGS. 10a-10d are diagrams showing the relationship between the timings indicating the drive dependency on the difference between fields on the appearance of white spots and the number of the white spots.
Figure 10B:
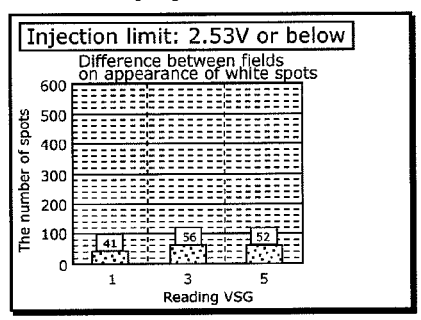

FIG. 10(a) is a diagram showing the timings of the pumping drive corresponding to those in FIG. 8(c). FIG. 10(b) is a diagram showing the relationship between these timings and the numbers of white spots at the respective timings. Note that the intervals of change are extended here compared to those in FIG. 8(c). In other words, as shown in FIG. 10(a), the driving pulse control unit 50 simultaneously changes the driving pulses φV1, φV3 and φV5 into the middle level during the change points from 120T to 312T, 504T to 696T, 888T to 1086T, and 1272T to 1464T. In contrast to the driving pulses φV1, φV3 and φV5, the driving pulse control unit 50 simultaneously changes the driving pulses φV2, φV4 and φV6 into the low level during the change points from 120T to 312T, 504T to 696T, 888T to 1086T, and 1272T to 1464T.

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

It is possible to decrease white spots also by pumping drive in which intervals of change are extended in this way. However, as a result of the extension of the intervals of change, the number of accumulated holes becomes greater than that in the case of the pumping drive shown in FIG. 8(c), resulting in an increase in the number of white spots. Accordingly, it is possible to decrease the number of white spots by shortening the intervals of change at which the driving pulses φV1, φV3 and φV5 are changed from low level to middle level, and the driving pulses φV2, φV4 and φV6 are changed from middle level to low level respectively.

Figure 10C:
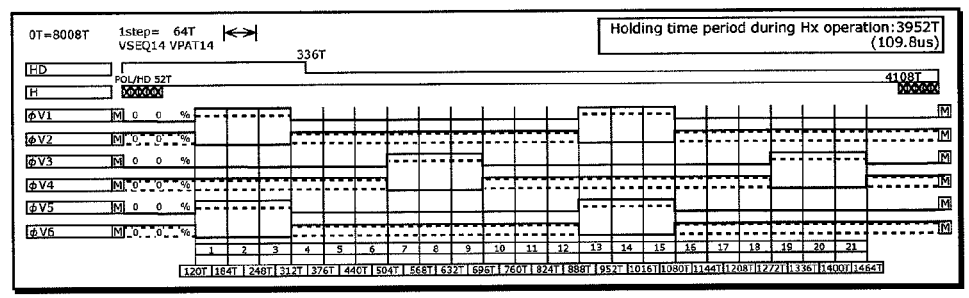
Figure 10D:
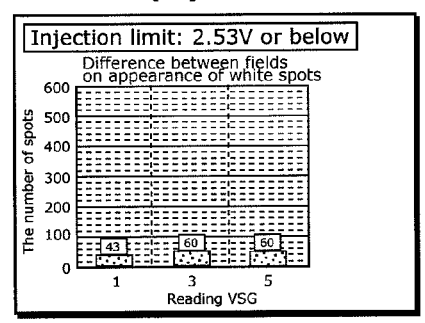

In addition, FIG. 10(c) is a diagram showing the timings similar to those in a pumping drive. FIG. 10(d) is a diagram showing the relationship between the timings and the numbers of white spots at the timings.

In the timings similar to those in the pumping drive, as shown in FIG. 10(c), as to the driving pulses φV1 and φV5, the driving pulse control unit 50 simultaneously changes them into the middle level during the change points from 120T to 312T, and 888T to 1086T. As to the driving pulses φV3, the driving pulse control unit 50 changes it into the middle level during the change points from 504T to 696T, and 1272T to 1464T. In contrast to the driving pulses φV1 and φV5, the driving pulse control unit 50 simultaneously changes the driving pulses φV2 and φV6 into the low level during the change points from 120T to 312T, and 888T to 1086T. As to the driving pulses φV4, the driving pulse control unit 50 changes it into the low level during the change points from 504T to 696T, and 1272T to 1464T.

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

As shown in FIG. 10(d), it is possible to decrease white spots also by this driving similar to the pumping drive, similarly to the case of the pumping drive shown in FIG. 10(a).

Figure 11A:
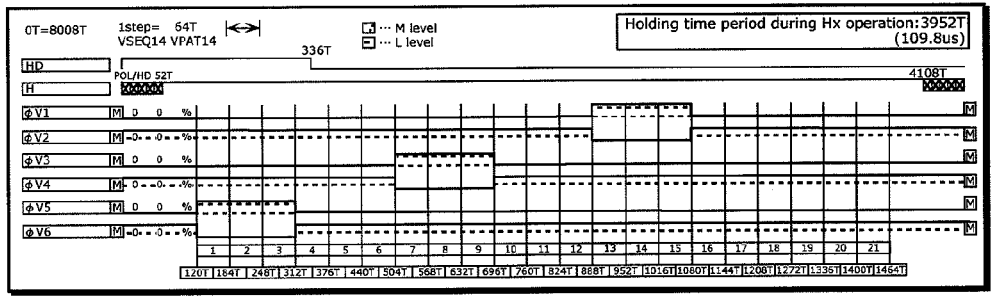
FIGS. 11a-11d are diagrams showing the relationship between the timings indicating the drive dependency on the difference between fields on the appearance of white spots and the number of the white spots.
Figure 11B:
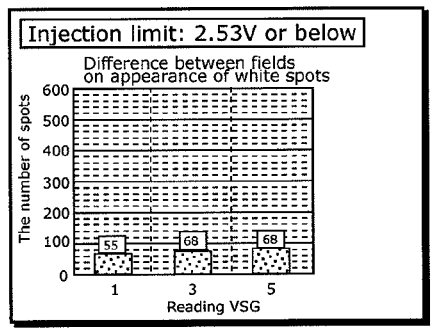

In addition, FIG. 11(a) is a diagram showing other timings similar to those in a pumping drive. FIG. 11(b) is a diagram showing the relationship between the timings and the numbers of white spots at the timings.

In the timings similar to those in the pumping drive, as shown in FIG. 10(a), the driving pulse control unit 50 changes, to the low level, the driving pulse φV1 during the change points from 888T to 1086T, the driving pulse φV3 during the change points from 504T to 696T, and the driving pulse φV5 during the change points from 120T to 312T respectively. In addition, the driving pulse control unit 50 changes, to the middle level, the driving pulse φV2 during the change points from 888T to 1086T, the driving pulse φV4 during the change points from 504T to 696T, and the driving pulse φV6 during the change points from 120T to 312T respectively.

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

As shown in FIG. 11(b), it is possible to decrease white spots also by this driving similar to the pumping drive, similarly to the case of the pumping drive shown in FIG. 10(a).

Figure 11C:
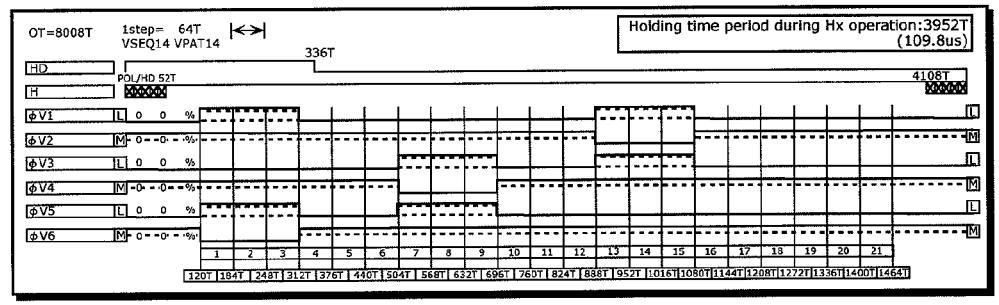
Figure 11D:
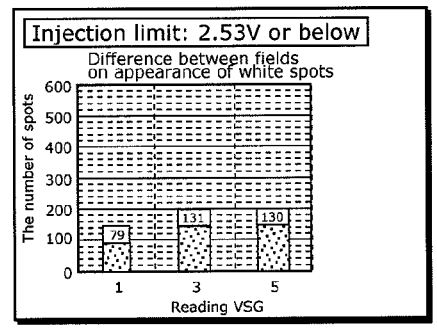

In addition, FIG. 11(c) is a diagram showing other timings similar to those in a pumping drive. FIG. 11(d) is a diagram showing the relationship between the timings and the numbers of white spots at the timings.

In the timings similar to those in the pumping drive, as shown in FIG. 11(c), the driving pulse control unit 50 changes, to the middle level, the driving pulse φV1 during the change points from 120T to 312T and the change points from 888T to 1086T, the driving pulse φV3 during the change points from 504T to 696T and the change points from 888T to 1086T, and the driving pulse φV5 during the change points from 120T to 312T and the change points from 504T to 696T respectively. In addition, the driving pulse control unit 50 changes, to the middle level, the driving pulse φV2 only during the change points from 888T to 1086T, the driving pulse φV4 only during the change points from 504T to 696T, and the driving pulse φV6 only during the change points from 120T to 312T respectively.

During the time periods other than the above-mentioned time periods, the driving pulses φV1, φV3 and φV5 are maintained at the low level, the driving pulses φV2, φV4 and φV6 are maintained at the middle level, and holes are accumulated immediately below the respective read-out gates which are set at the low level.

In other words, as for pairs of an even-ordinal-number phase and an odd-ordinal-number phase, a driving pulse is applied to only one of each pair, in other words, and the corresponding inverse-level driving pulse is not applied to the other one of each pair.

As shown in FIG. 11(d), it is known that the number of white spots increases because dispersion of holes is further inhibited due to the application of a driving pulse only to one of each pair like this.

Accordingly, the results of analyzing the various kinds of driving show that it is possible to decrease white spots in the case of the driving similar to the pumping drive shown in FIG. 10(c) and FIG. 11(a) in addition to the case of the pumping drive shown in FIG. 10(a). In the former case, as for the pairs of an even-ordinal-number phase and an odd-ordinal-number phase, driving pulses which simultaneously change the read-out gates from LOW voltage states which are standby states to MIDDLE voltage states, and driving pulses which change the non-read-out gates from LOW voltage states to MIDDLE voltage states at the same time when the driving pulses to the read-out gates are changed from the standby LOW voltage states to MIDDLE voltage states.

In addition, it is possible to decrease white spots also by shortening the intervals of change at which the driving pulses φV1, φV3 and φV5 are changed from low level to middle level, and the driving pulses φV2, φV4 and φV6 are changed from middle level to low level respectively.

Next, an analysis was made about the case of executing a sequential driving as shown in FIG. 9(a) and shifting the change points of the non-read-out gate (φV6 gate in FIG. 9)

adjacent to the read-out gate (φV5 gate in FIG. 9) which is the last gate among the standby gates which change from low level to middle level.

The following is an analysis about position dependency of the change point at which V8 in eight-phase driving changes from middle level to low level for the first time. Note that the position of the change point at the time when the last phase in the eight-phase driving changes from middle level to low level for the first time is also denoted as the position of the first change point.

Figure 12:
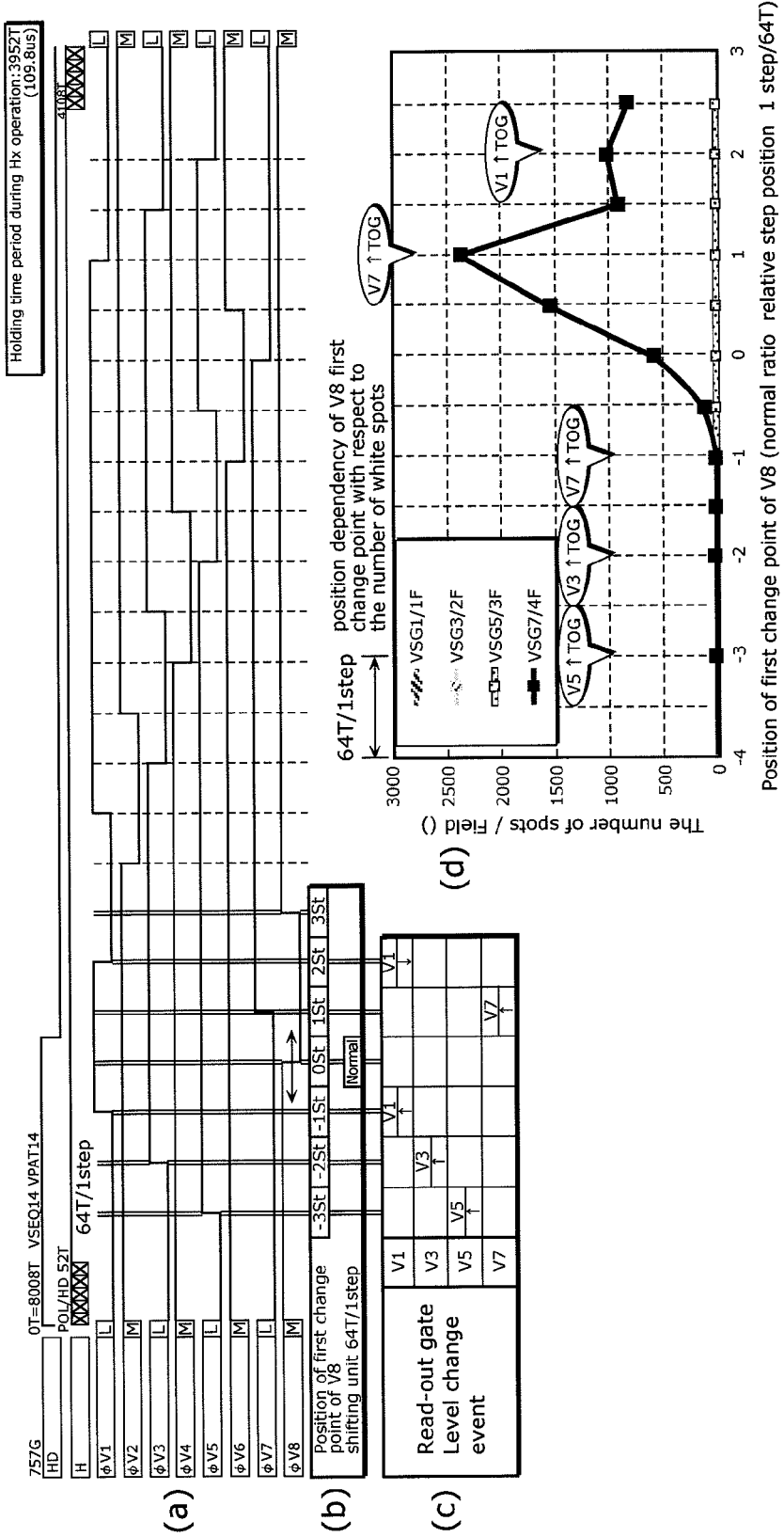
FIG. 12 is a diagram showing the dependency of the position of the first change point of V8 in eight-phase driving.

FIG. 12 is a diagram showing the position dependency of the position of the first change point. In particular, FIG. 12(a) is a diagram showing normal timings corresponding to V1 to V7 in FIG. 12(c). FIG. 12(b) is a diagram showing a shifting unit of shifting the position of the first change point from V8 of FIG. 12(a) determined as a reference point. FIG. 12(c) is a diagram showing the events of changing the levels of the driving pulses φV1, φV3, φV5, and φV7, applied to the read-out gates. FIG. 12(d) is a diagram showing the relationship between the shifting unit of the position of the first change point and the number of white spots.

Here, an analysis is made about the change of difference between the fields on the appearance of white spots in the case where the position of the first change (M to L) point of V8 is shifted is forwardly and backwardly in a conventional pattern of V-level change during a long-time accumulation.

The analysis shows that white spots have tendency to increase in the case where the timing at which the level of V7 changes is regarded as its peak in the VSG7 read-out field, after the timing at which the level of V1 changes, in other words, the shifting direction is regarded as plus (+). After the turning point, the number of white spots decreases to a certain level, but it does not return to the original level. Thus, the difference between the fields on the appearance of white spots is not compensated.

In contrast, in the case of assuming that the shifting direction is minus (−), it is known that white spots decrease as the change points are shifted from the change point φV1 to the change point φV3 and further to the change point φV5. In other words, white spots decrease according to a third driving where the driving pulse φV8 is maintained at the low level at the two change points of the driving pulses φV7 and φV1.

In other words, it is possible to dramatically decrease the number of white spots also by sequentially applying, to N-numbers of read-out gates, driving pulses which change the N read-out gates from standby LOW voltage states to MIDDLE voltage states and applying, to at least one of non-read-out gates, a driving pulse which changes the at least one of non-read-out gates into a LOW voltage state. The at least one of non-read-out gates are adjacent to one of the N−1th read-out gate and the Nth read-out gate in this change order and is made into a LOW-voltage state during the application time period of the N−1th to Nth read-out gates in this change order.

Here, as described earlier, it is possible to dramatically decrease white spots in photodiodes by the driving according to the present invention such as the sequential driving of FIG. 9(a) or the like and the pumping drive of FIG. 8(c) or the like. However, excess electric charge may be injected as noises also to the channels of vertical CCDs due to storage of holes, dispersion and movement of holes. Thus, as described above, after completing the execution of a long-time storage mode, the driving pulse control unit 50 drives to transfer only the vertical CCDs 43, executes a vertical CCD sweep-out mode for sweeping out noises in the channels of the vertical CCDs 43, and subsequently, it causes the vertical CCDs 43 to read out the electric charge accumulated in all the photodiodes 41.

Accordingly, it is possible to transfer only the electric charge without white spots from the vertical CCDs 43 to the horizontal CCDs 45 and output it via the output amplifier 46.

In addition, there is a case where the above-mentioned vertical CCD sweep-out mode becomes further effective in the case of using the driving according to the present invention. More specifically, while noise electrons accumulated in the non-read-out gates are sequentially transferred even during the time period of the long-time accumulation mode in the driving shown in FIG. 8(a), such noise electrons are not completely transferred in the driving such as the sequential driving of FIG. 9(a) and the pumping drive of FIG. 8(c) of the present invention, and therefore, it is possible to obtain signal output with fewer noises by sweeping out the noise electrons which remains untransferred by a vertical CCD sweep-out mode.

In the case of the driving of FIG. 9(a), the φV6 gate changes from middle level to low level when the adjacent gate remains at the low level. Hence, noise electrons immediately below the gate are not always transferred in a normal transfer direction. In addition, also in the case of the driving of FIG. 8(c), adjacent gates simultaneously change into the inverse level. Under these circumstances, noise electrons immediately below the gate are not always transferred in a normal transfer direction, similarly to the former case. Accordingly, in addition to the driving of the present invention, executing a vertical CCD sweep-out mode makes it possible to generate a synergistic effect of decreasing white spots, stabilizing the potential of the substrate, and decreasing noises.

Note that the driving pulses of φV1 to φV6 (φV7 and φV8) are applied to the read-out gates and the non-read-out gates in this order in this embodiment, but it is possible to obtain the same effect also in the case of exchanging the order of applying the pulses to these gates.

In addition, examples of 3 to 1 interlace ratio and 4 to 1 interlace ratio are mainly described in this embodiment, but it is possible to obtain the same effect also in the case of using another structure.

Further, φV2, φV4 and φV6 are simultaneously changed into the inverse level at the time of pumping drive of φV1, φV3 and φV5, however, only one of φV2, φV4 and φV6 adjacent to the φV1, φV3 and φV5 which are subjected to pumping drive may be changed into the inverse level.

An IT-type solid-state imaging apparatus is used in the execution in this embodiment. However, a solid-state imaging apparatus of a frame interline transfer (FIT) type having accumulation units each arranged between a vertical CCD 43 and a horizontal CCD 45 may be used in the execution. Such solid-state imaging apparatus of FIT type is structured so that it can execute different vertical transfer drive in the imaging area and the accumulation unit. Therefore, driving the imaging area using the driving method of the present invention makes it possible to obtain an effect of decreasing white spots and stabilizing the potential of the substrate without the long-time accumulation mode.

In addition, the same effect can be obtained also in the case of using a solid-state imaging apparatus having three or more transfer gates per a photodiode. Such a solid-state imaging apparatus includes a solid-state imaging apparatus of progress type.

Second Embodiment

Next, a second embodiment of the present invention is described. In this second embodiment, electric charge is read out to vertical CCDs at new timings in addition to or separate from the driving timings in the first embodiment. This is specifically described. It is assumed here that a solid-state imaging device is capable of reading electric charge accumulated all the photodiodes to the vertical CCDs by executing N-times of read-out operations. Driving pulses for changing all continuous 2N-numbers of gates from LOW-voltage states to MIDDLE-voltage states in sequence (in other words, in shifted timings) are applied to the gates as a "transition operation" at the time of starting a transfer operation of a field or a frame. The 2N-numbers of gates include N-numbers of read-out gates and N-numbers of non-read-out gates.

In other words, a function of executing a transition operation during a transition time period onto a solid-state imaging apparatus and a camera described in the first embodiment is added in this embodiment. Here, the transition time period refers to the time period from the completion of field transfer to the start of another field transfer, and at the time when the first field transfer is started. In the transition time period, vertical CCDs are standby, and conventionally, all the driving pulses $\phi V1$ to $\phi V6$ are at the low level. However, in this embodiment, all the driving pulses $\phi V1$ to $\phi V6$ are changed from LOW-voltage level to MIDDLE-voltage level in sequence immediately before the start of transfer.

Figure 1:
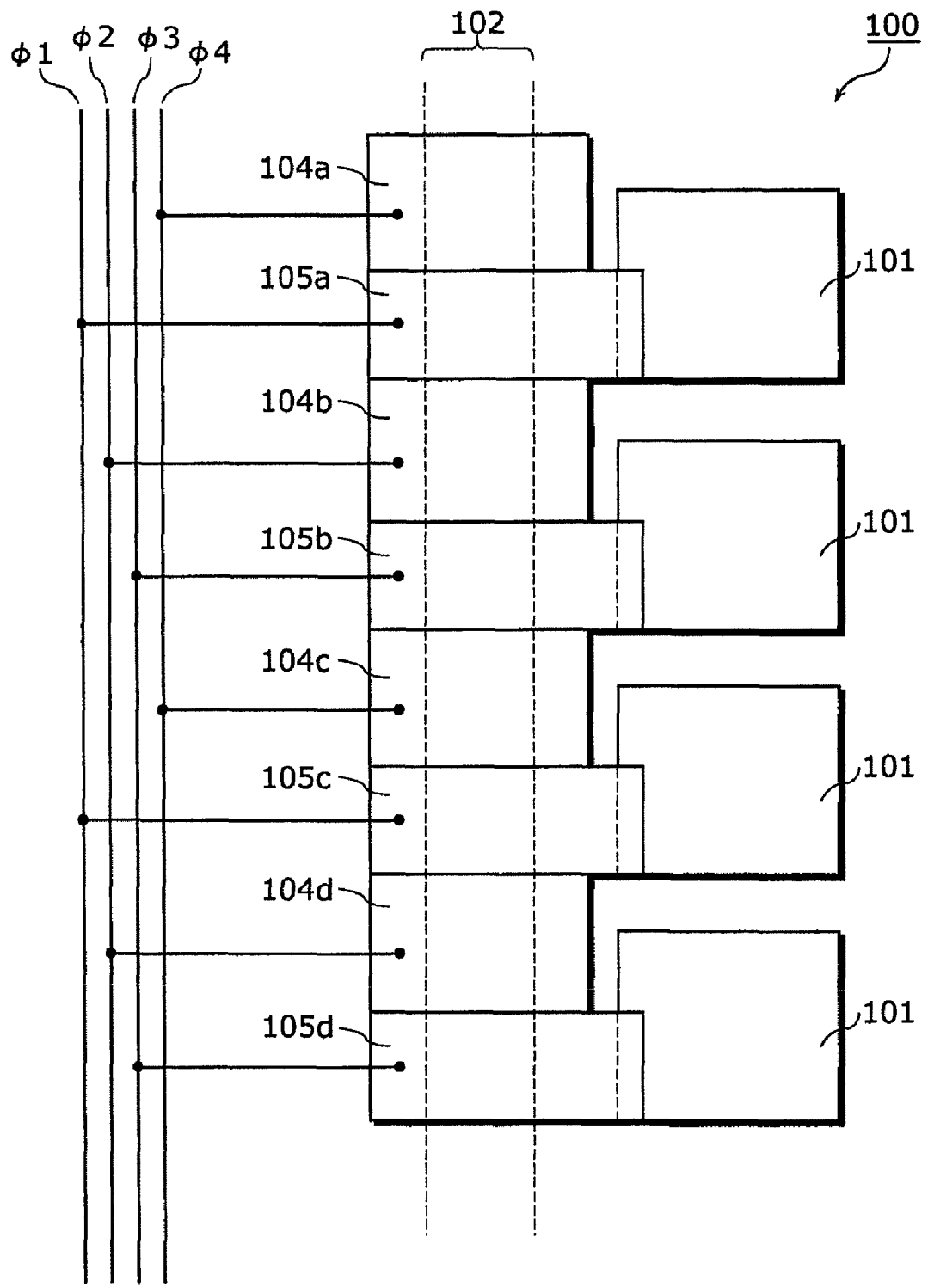
FIG. 1 is a diagram showing an enlarged view of an area of a FITCCD.
Figure 2A:
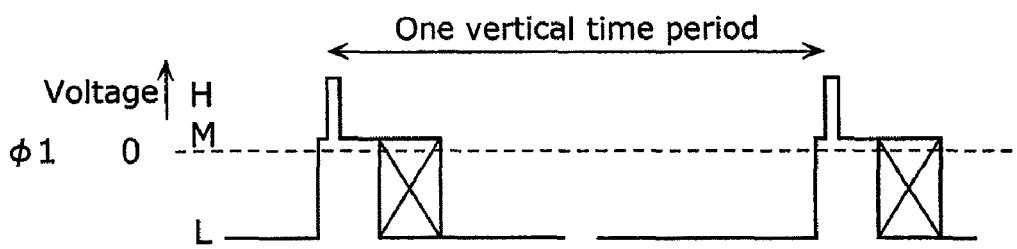
FIGS. 2a-2d are diagrams of voltage waveforms illustrating a conventional driving method.
Figure 2B:
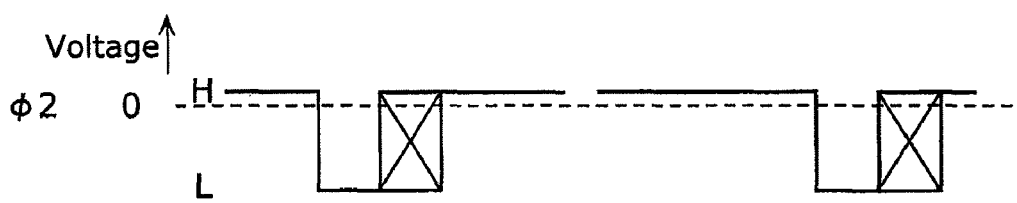
Figure 2C:
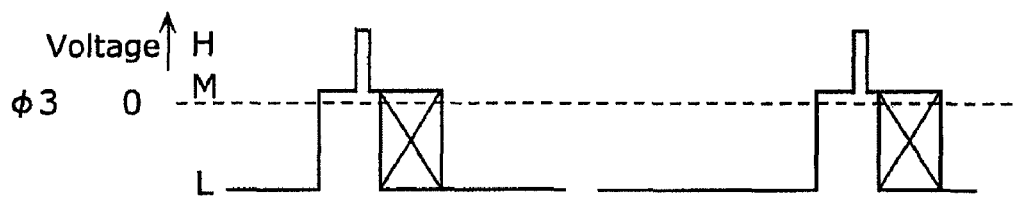
Figure 2D:
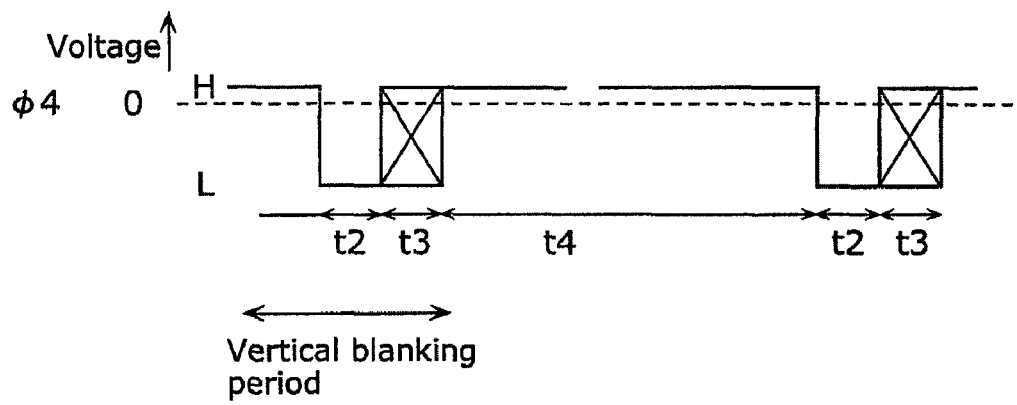

The structures of the camera and solid-state imaging apparatus in this embodiment are the same as those in FIG. 1 and FIG. 2 except only that the function of executing the transition operation is added. Hereinafter, a description as to the same points is omitted, and the different point is mainly described.

Figure 13:
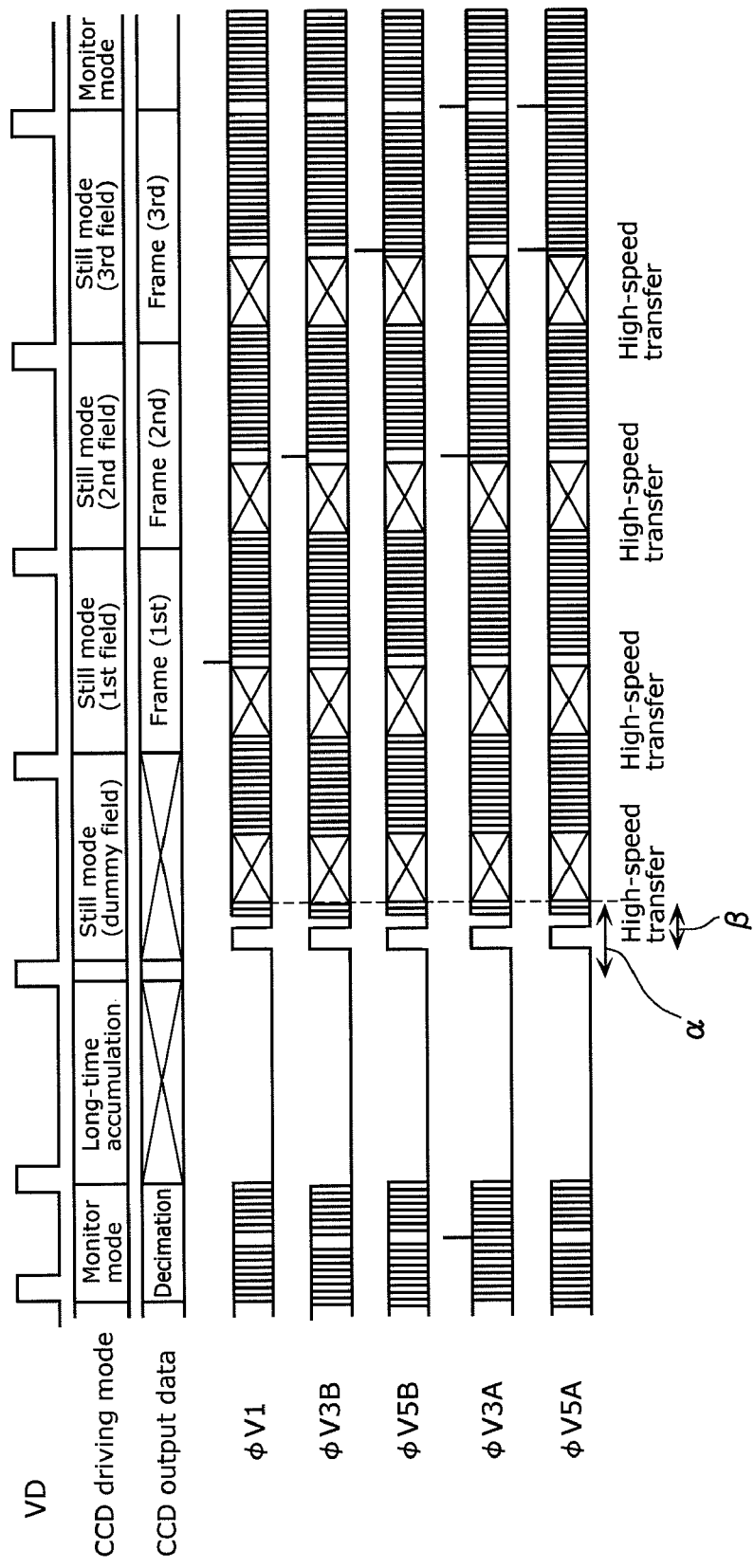
FIG. 13 is a diagram showing an operation sequence from a long-time accumulation mode to the completion of plural-times of field transfer.

FIG. 13 is a diagram showing the operation sequence from a long-time accumulation mode to the completion of plural-times of field transfer.

The figure shows the timings of a vertical synchronous signal VD, a CCD driving mode and a driving pulse. The vertical synchronous signal VD corresponds to the transition operation of various types of CCD driving modes. The CCD driving mode returns to a monitor mode after a monitor mode, a long-time accumulation mode, a still mode (dummy field mode) and a still mode (first field to third field). As the data output from the CCD, image signals compliant with a CCD driving mode such as decimation output and frame output is outputted. In a long-time accumulation mode, all the gates are in a LOW-voltage state.

Here, the time period $\alpha$ denotes the transition operation at the time when the first field transfer is started among the transition operations. The time period $\beta$ denotes the timing of the transition operation executed within the transition time period $\alpha$. Note that the first field is a dummy field in FIG. 13, but the present invention does not always require dummy field transfer like this.

Figure 14:
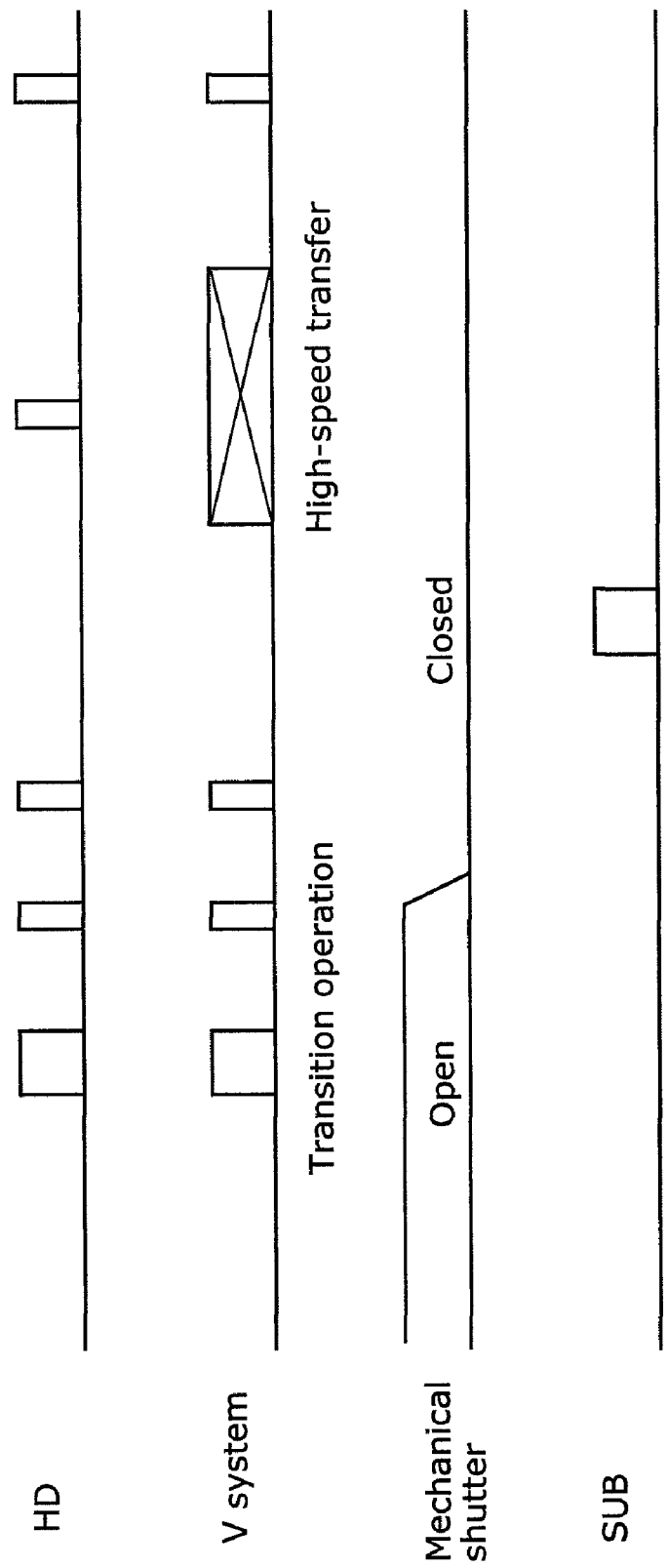
FIG. 14 is a sequence diagram showing the fine driving timings in a transition time period $\alpha$ in FIG. 13.

FIG. 14 is a sequence diagram showing fine driving timings in the transition time period $\alpha$ in FIG. 13. The figure shows the timings of a horizontal synchronous signal HD, a V system indicating the driving pulses $\phi V1$ to $\phi V6$, a mechanical shutter and a substrate bias voltage SUB applied to a semiconductor substrate.

In the figure, the horizontal synchronous signal HD shows the timings after the first horizontal synchronous pulse in field transfer. As shown in the timing of the V system in the figure, the time period $\beta$ corresponds to the time period of the first horizontal synchronous pulse. A transition operation executed in this time period in this embodiment. As known from this figure, a transition operation is executed (a) at the time when the first field transfer is started or (b) at the time when high-speed transfer of the vertical CCDs is started. This makes it possible to control inverse infusion of excess electric charge before the vertical transfer is started and prevent white spots from occurring.

As known from the timings of a mechanical shutter and a substrate bias voltage SUB in the figure, a first substrate bias modulation is executed in an exposure period, and a second substrate bias modulation is executed after the exposure period and the transition operation are completed.

Figure 15:
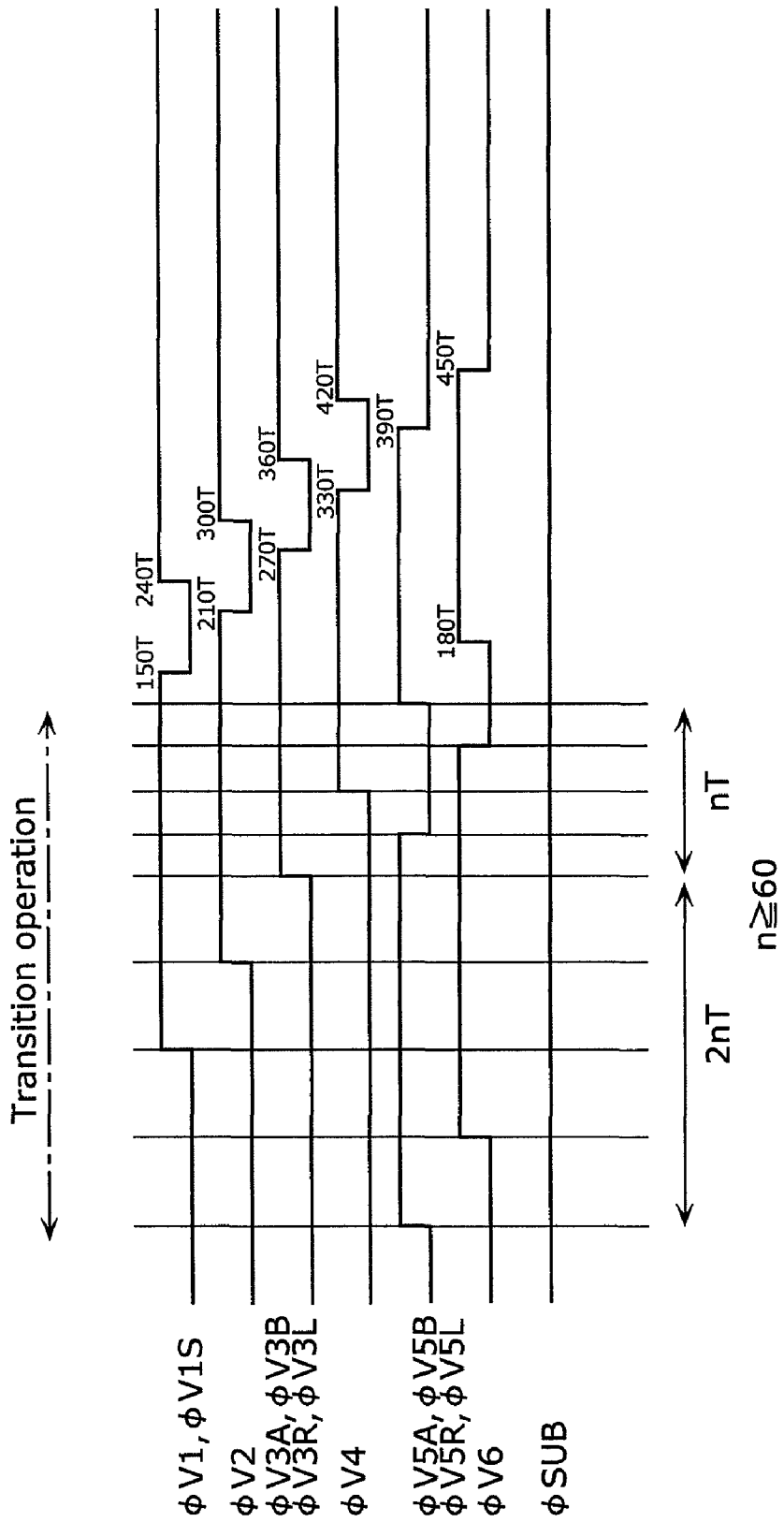
FIG. 15 is a diagram showing the operation timings of a V system executed around the time period $\beta$ shown in FIG. 13.

FIG. 15 is a diagram showing the operation timing (that is, the details of a transition operation) of a V system executed around the time period $\beta$ shown in FIG. 13. Note that the figure also shows the timing of $\phi SUB$. Here, "T" is the interval of a horizontal driving clock.

As known from the figure, in the transition operation, the timings of the respective driving pulses applied to the read-out gates and the non-read-out gates are sequentially shifted and they are changed from LOW-voltage states to MIDDLE-voltage states. This makes it possible to apply pulses for changing the voltage states at different timings, disperse excess electric charge, and prevent electric charge from being injected from the semiconductor substrate. Accordingly, it is possible to prevent white spots due to electric charge generated at the time when the holes move.

Figure 16:
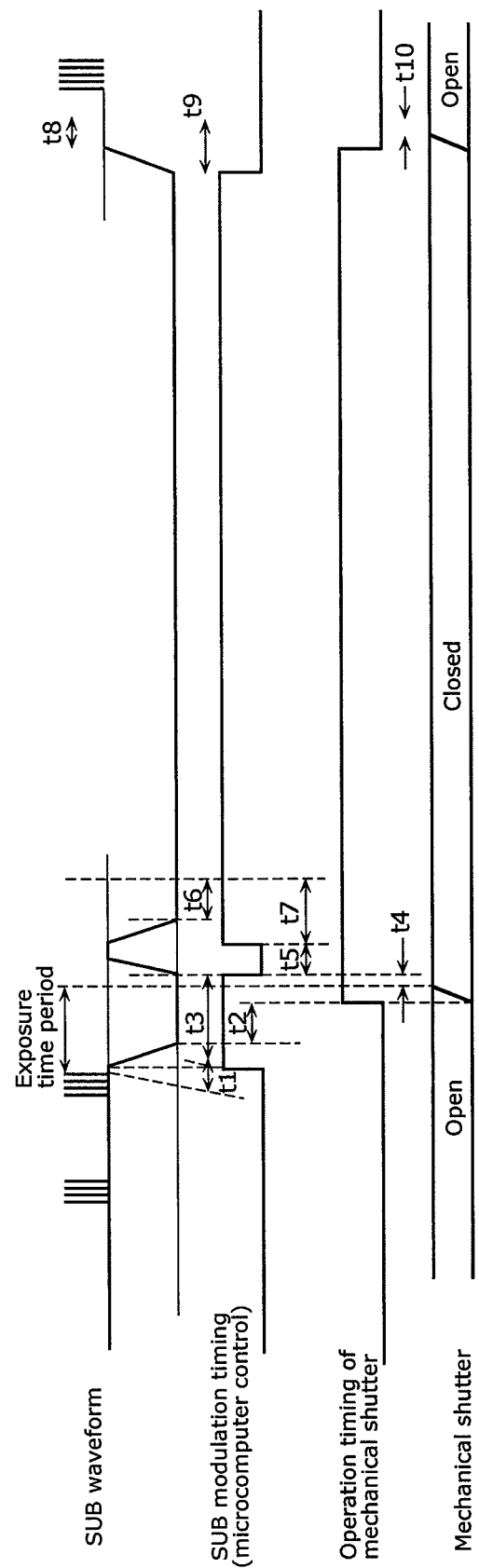
FIG. 16 is a timing chart showing fine timings of a bias modulation of a substrate.

FIG. 16 is a timing chart showing fine timings of substrate bias modulation. The figure shows a SUB waveform representing substrate bias voltage (Vsub of FIG. 2) applied to the semiconductor substrate, a SUB modulation timing showing the VsubCont signal of FIG. 2, the operation timing of a mechanical shutter, and the open/close timings of the mechanical shutter.

In the figure, the approximate time period of time point t3 to t5 in the SUB waveform shows the first bias modulation, and the time period from t6 to the start of the time period t8 shows the second bias modulation. In the first bias modulation, the overflow barrier is changed to the high level before the completion of an exposure period and signal electric charge is accumulated up to the height of the barrier of the read-out gate. In this way, the linearity of the amount of saturation signal electric charge of photodiodes is increased. In the second bias modulation, the height of the overflow barrier is changed to the low level during the time between the completion of the exposure period and the start of the transfer of the vertical CCDs.

In this way, the first bias modulation for changing the overflow barrier to the high level before the completion of an exposure period so as to accumulate signal electric charge up to the height of the barrier of the read-out gate and the second bias modulation for changing the height of the overflow barrier to the low level during the time between the completion of the exposure period and the start of the sweep-out of electric charge in the vertical CCDs are executed in this embodiment. This makes it possible to prevent blooming of signal electric charge from photodiodes to vertical CCDs.

Executing a transition operation before executing the second bias modulation as shown in FIG. 16 makes it possible to stabilize the P-type well area 91 of the semiconductor substrate.

Figure 17:
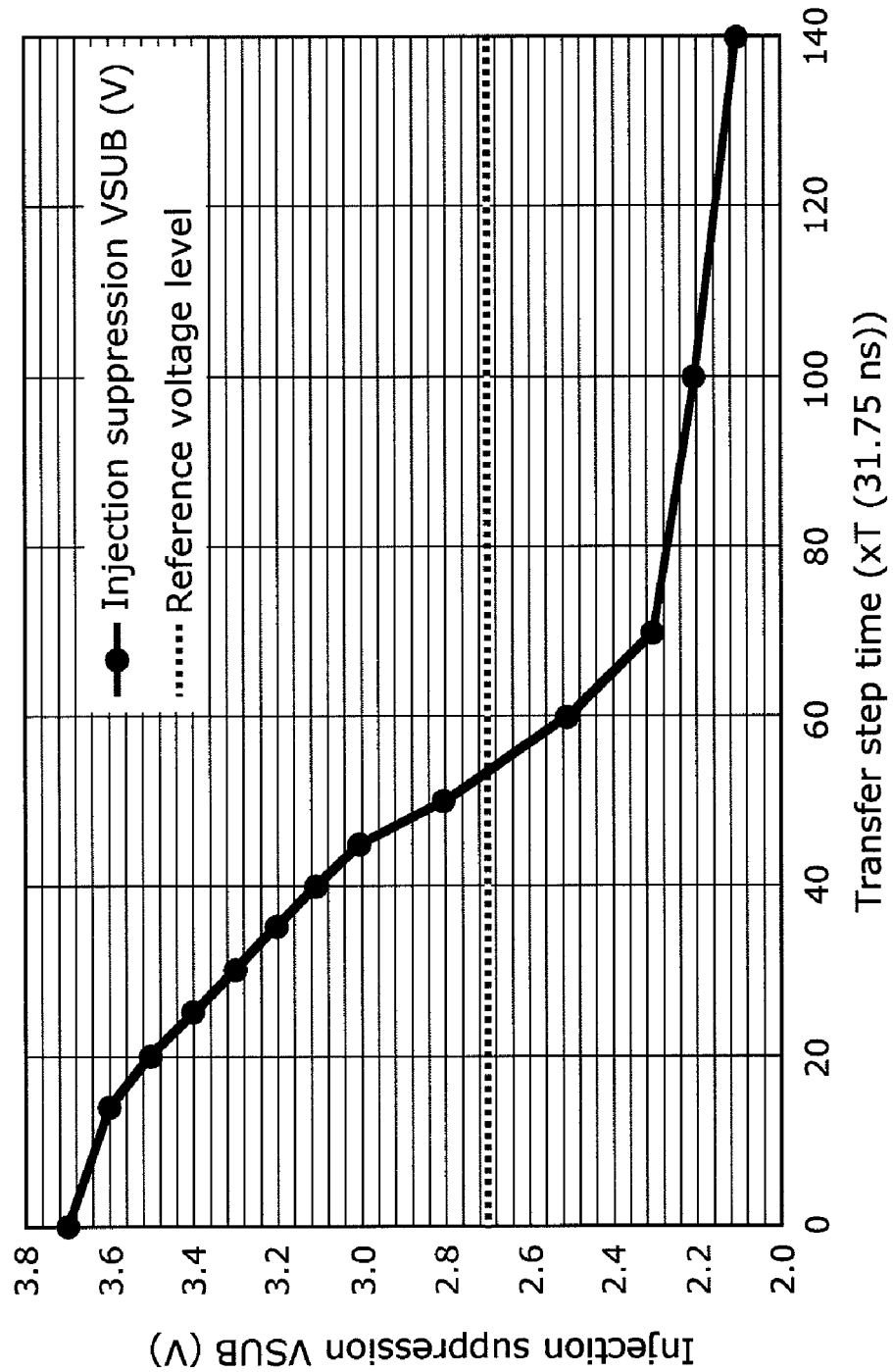
FIG. 17 is a diagram showing the time dependency of transfer steps of injection suppression SUB.

FIG. 17 is a diagram showing the time dependency of the transfer steps of injection suppression SUB. Here, the vertical axis represents "injection suppression SUB (V)". The "injection suppression SUB (V)" is voltage (V) for suppressing an inverse injection of excess electric charge from the semiconductor substrate to photodiodes. In other words, the vertical axis is the voltage necessary for suppressing the occurrence of excess electric charge. The lower the voltage, the smaller the amount of excess electric charge (the better the characteristics). In addition, the horizontal axis represents the "transfer step time". The "transfer step time" shows time differences (differences in rising time) of the rising timings of the respective driving pulses to be applied to the read-out gates and non-read-out gates in a "transition operation". Here, the "transfer step time" is shown using multiples of the interval (T: for example, 31.75 ns) of the horizontal driving clock. In addition, in the figure, the horizontal axis placed at the position of injection suppression SUB of about 2.7 V is a reference voltage level indicating that the amount of generated excess electric charge is small.

As shown from this figure, in order to suppress the amount of generated excess electric charge below the reference voltage level, it is preferable that the "transition operation" corresponds to such transfer step time that is longer than a certain transfer step time. In other words, it is possible to suppress the amount of generated excess electric charge below the reference level constantly by rising all the respective driving pulses to be applied to the read-out gates and non-read-out gates so as to change them from LOW-voltage states to MIDDLE-voltage states in sequence at a time interval shifted to be greater than the constant reference time.

For example, it is known that a transfer step in a normal operation is 30T in FIG. 16, but the time for a transfer step is greater than this in a transition operation.

Note that the relationship between the time for a transfer step and a voltage for suppressing unnecessary electric charge shown in this embodiment vary depending on the size of a device, dispersion processing and the like, and thus the values mentioned in this embodiment do not limit the relationship. Likewise, as the time for a transfer step becomes longer, the P-type well area 91 of a semiconductor substrate tends to be in a stable state so that a voltage for suppressing unnecessary electric charge decreases.

In addition, also in this embodiment, the same effect can be obtained also in the case of using a solid-state imaging apparatus having three or more transfer gates per a photodiode. Such a solid-state imaging apparatus includes a solid-state imaging apparatus of progress type.

INDUSTRIAL APPLICABILITY

A solid-state imaging apparatus of the present invention is applicable to high-definition digital cameras, video cameras and the like.

What is claimed is:

1. A solid-state imaging apparatus, comprising:
a solid-state imager including a semiconductor substrate, photodiodes which are two-dimensionally formed on said semiconductor substrate, and vertical charge-coupled devices (CCDs) having at least one arranged read-out gate and non-read-out gate for each of said photodiodes, the read-out gate being for reading out accumulated electric charge from an associated photodiode, and the non-read-out gate being not for reading out accumulated electric charge from the associated photodiode; and
a driving pulse controller operable to control said solid-state imager by applying driving pulses to respective read-out gates and non-read-out gates at predetermined timings,
wherein said driving pulse controller is operable to:
apply driving pulses sequentially to said respective read-out gates in order to change said respective read-out gates from stand-by LOW-voltage states to MIDDLE-voltage states; and
apply a driving pulse for maintaining a LOW-voltage state to at least one of non-read-out gates adjacent to a last read-out gate in an order of a change among said non-read-out gates, during the change of said respective read-out gates starting with a first read-out gate and ending with the last read-out gate.

2. The solid-state imaging apparatus according to claim 1, wherein said solid-state imager is operable to read out electric charge accumulated in all of said photodiodes to said vertical CCDs by executing N-times of read-out operations, N being an arbitrary positive integer, and
said driving pulse controller is further operable to apply driving pulses for changing all of gates from LOW-voltage states to MIDDLE-voltage states at a starting time of a transfer operation of a field or a frame, said all of gates being composed of N-numbers of read-out gates and at least N-numbers of non-read-out gates, and the application of driving pulses being executed as a transition operation preparatory to the transfer operation.

3. The solid-state imaging apparatus according to claim 2, wherein said driving pulse controller is operable to execute the transition operation either (a) at a starting time of transferring a first field or (b) at a starting time of transferring said vertical CCDs at high speed.

4. The solid-state imaging apparatus according to claim 2, wherein said driving pulse controller is further operable to:
execute a first bias modulation and a second bias modulation, the first bias modulation being for accumulating signal electric charge up to a height of each read-out gate by changing an overflow barrier of said read-out gate to a high level before an end of an exposure time period, and the second bias modulation being for changing the overflow barrier to a low level between the end of the exposure time period and a start of sweeping out of electric charge of said vertical CCDs; and
execute the transition operation between the end of the exposure time period and a start of the second bias modulation.

5. A camera comprising a solid-state imaging apparatus according to claim 1.

6. The solid-state imaging apparatus according to claim 1, wherein said driving pulse controller is operable to apply the driving pulses in a long-time accumulation mode in which electric charge is accumulated in each of said photodiodes during two or more vertical time periods.

7. A solid-state imaging apparatus, comprising:
a solid-state imager including a semiconductor substrate, photodiodes which are two-dimensionally formed on said semiconductor substrate, and vertical CCDs having at least one arranged read-out gate and non-read-out gate for each of said photodiodes, the read-out gate being for reading out accumulated electric charge from an associated photodiode, and the non-read-out gate being not for reading out accumulated electric charge from the associated photodiode; and
a driving pulse controller operable to control said solid-state imager by applying driving pulses to respective read-out gates and non-read-out gates at predetermined timings,
wherein said solid-state imager is operable to read out electric charge accumulated in all of said photodiodes to said vertical CCDs by executing N-times of read-out operations, and
said driving pulse controller is operable to:
apply driving pulses sequentially for changing N-numbers of read-out gates from stand-by LOW-voltage states to MIDDLE-voltage states; and
apply a driving pulse for maintaining a LOW-voltage state to at least one of non-read-out gates adjacent to N−1th read-out gate and Nth read-out gate in an order of the change among said non-read-out gates, during the change starting with the N−1 th read-out gate and ending with the Nth read-out gate, N being an arbitrary positive integer of at least two.

8. The solid-state imaging apparatus according to claim 7, wherein said driving pulse controller is operable to apply the driving pulses in a long-time accumulation mode in which electric charge is accumulated in each of said photodiodes during two or more vertical time periods.

9. A solid-state imaging apparatus, comprising:
a solid-state imager including a semiconductor substrate, photodiodes which are two-dimensionally formed on said semiconductor substrate, and vertical CCDs having at least one arranged read-out gate and non-read-out gate for each of said photodiodes, the read-out gate being for reading out accumulated electric charge from an associated photodiode, and the non-read-out gate being not for reading out accumulated electric charge from the associated photodiode; and
a driving pulse controller operable to control said solid-state imager by applying driving pulses to respective read-out gates and non-read-out gates at predetermined timings,
wherein said driving pulse controller is operable to apply driving pulses sequentially to said respective read-out gates in order to change said respective read-out gates from stand-by LOW-voltage states to MIDDLE-voltage states simultaneously, and
wherein said driving pulse controller is further operable to apply driving pulses for changing said respective non-read-out gates from MIDDLE-voltage states to LOW-voltage states in parallel with applying driving pulses for changing said respective read-out gates from stand-by LOW-voltage states to MIDDLE-voltage states.

10. The solid-state imaging apparatus according to claim 9, wherein said driving pulse controller is operable to apply the driving pulses in a long-time accumulation mode in which electric charge is accumulated in each of said photodiodes during two or more vertical time periods.

11. A solid-state imaging apparatus, comprising:
a solid-state imager including a semiconductor substrate, photodiodes which are two-dimensionally formed on said semiconductor substrate, and vertical CCDs having one or more gates provided for each of said photodiodes, each of said gates transferring vertically electric charge read out from a corresponding one of said photodiodes; and
a driving pulse controller operable to control said solid-state imager by applying driving pulses to respective gates at predetermined timings,
said driving pulse controller is further operable to apply driving pulses for sequentially changing all of said respective gates from LOW-voltage states to MIDDLE-voltage states at a starting time of transfer operation of a field or a frame, the application of driving pulses being executed as a transition operation preparatory to the transfer operation,
wherein said driving pulse controller is operable to sequentially apply the driving pulses for changing said respective gates from LOW-voltage states to MIDDLE-voltage states with time shifts corresponding to time intervals longer than a constant reference time, and
wherein the constant reference time is 30 times longer than a cycle of a horizontal driving clock.

12. The solid-state imaging apparatus according to claim 11,
wherein each of said vertical CCDs has at least one arranged read-out gate and non-readout gate for each of said photodiodes, the read-out gate being for reading out accumulated electric charge from the corresponding one of said photodiodes, the non-read-out gate being not for reading out accumulated electric charge from the corresponding one of the photodiodes, and
said driving pulse controller is operable to control said solid-state imager by applying the driving pulses to respective read-out gates and non-read-out gates at predetermined timings.

13. A method for driving a solid-state imaging apparatus which includes: a solid-state imager including a semiconductor substrate, photodiodes which are two-dimensionally formed on the semiconductor substrate, and vertical CCDs having at least one arranged read-out gate and non-read-out gate for each of the photodiodes, the read-out gate being for reading out accumulated electric charge from an associated photodiode, and the non-read-out gate being not for reading out accumulated electric charge from an associated photodiode; and a driving pulse controller which controls the solid-state imager by applying driving pulses to respective read-out gates and non-read-out gates at predetermined timings, said method comprising:
a long-time accumulation mode for accumulating electric charge in each of the photodiodes during two or more vertical time periods; and
reading out electric charge accumulated in said long-time accumulation mode from each photodiode to the vertical CCDs, vertically transferring the electric charge, and outputting the electric charge,
wherein in said long-time accumulation mode, one of the following applications (i-a) and (i-b), or (ii), is executed:
(i-a) sequential application of driving pulses to said respective read-out gates, executed in order to change said read-out gates from stand-by LOW-voltage states to MIDDLE-voltage states, and (i-b) application of a driving pulse for maintaining a LOW-voltage state to at least one of non-read-out gates adjacent to a last read-out gate in an order of a change among said non-read-out gates, during the change of said read-out gates starting with a first read-out gate and ending with said last read-out gate; and
(ii) application of driving pulses to said respective read-out gates, executed in order to change said read-out gates from stand-by LOW-voltage states to MIDDLE-voltage states simultaneously.

14. A method for driving a solid-state imaging apparatus which includes: a solid-state imager including a semiconductor substrate, photodiodes which are two-dimensionally formed on the semiconductor substrate, and vertical CCDs having at least one arranged read-out gate and non-read-out gate for each of the photodiodes, the read-out gate being for reading out accumulated electric charge from an associated photodiode, and the non-read-out gate being not for reading out accumulated electric charge from an associated photodiode; and a driving pulse controller which controls the solid-state imager by applying driving pulses to respective read-out gates and non-read-out gates at predetermined timings, said method comprising:
a long-time accumulation mode for accumulating electric charge in each of the photodiodes during two or more vertical time periods;
a vertical CCD sweep-out mode for driving to transfer only the vertical CCDs before reading out electric charge accumulated in said long-time accumulation mode; and
reading out electric charge accumulated in said long-time accumulation mode from each photodiode to the vertical CCDs, vertically transferring the electric charge, and outputting the electric charge, wherein in said long-time accumulation mode, one of the following applications (i-a) and (i-b), or (ii), is executed:

(i-a) sequential application of driving pulses to said respective read-out gates, executed in order to change said read-out gates from stand-by LOW-voltage states to MIDDLE-voltage states, and (i-b) application of a driving pulse for maintaining a LOW-voltage state to at least one of non-read-out gates adjacent to a last read-out gate in an order of a change among said non-read-out gates, during the change of said read-out gates starting with a first read-out gate and ending with said last read-out gate; and (ii) application of driving pulses to said respective read-out gates, executed in order to change said read-out gates from stand-by LOW-voltage states to MIDDLE-voltage states simultaneously.

15. A solid-state imaging apparatus, comprising:

a solid-state imager including a semiconductor substrate, photodiodes which are two-dimensionally formed on said semiconductor substrate, and vertical charge-coupled devices (CCDs) having one or more read-out gates provided for each of said photodiodes, and said one or more read-out gates being for reading out accumulated electric charge from an associated photodiode; and a driving pulse controller operable to control said solid-state imager by applying driving pulses to respective one or more read-out gates at predetermined timings, said driving pulse controller is further operable to apply driving pulses for initially setting all of said read-out gates at LOW-voltage and after that sequentially changing all of said read-out gates from LOW-voltage states to MIDDLE-voltage states during the change starting with a first read-out gate and ending with a last read-out gate, the application of driving pulses being executed as a transition operation preparatory to a transfer operation.

16. The solid-state imaging apparatus according to claim 15, wherein the vertical charge-coupled devices further having one or more non read-out gates provided for each of said photodiodes, and said one or more non read-out gate being not for reading out accumulated electric charge from the associated photodiode.

17. The solid-state imaging apparatus to claim 15, wherein said driving pulse controller is operable to sequentially apply the driving pulses for changing respective one or more read-out gates from LOW-voltage states to MIDDLE-voltage states with time shifts corresponding to time intervals longer than a constant reference time while said transition operation preparatory to the transfer operation.

18. The solid-state imaging apparatus to claim 17, wherein said constant reference time is 30 times longer than a cycle of a horizontal driving clock.

* * * * *